(12) United States Patent
Altonen et al.

(10) Patent No.: US 11,515,827 B2
(45) Date of Patent: Nov. 29, 2022

(54) LOAD CONTROL DEVICE HAVING AN ILLUMINATED ROTARY KNOB

(71) Applicant: Lutron Technology Company LLC, Coopersburg, PA (US)

(72) Inventors: Gregory S. Altonen, Easton, PA (US); Chris Dimberg, Easton, PA (US); Matthew P. McDonald, Phoenixville, PA (US); Nikhil V. Bhate, East Norriton, PA (US); Rebecca Michalski, Hellertown, PA (US)

(73) Assignee: Lutron Technology Company, LLC, Coopersburg, PA (US)

(*) Notice: Subject to any disclaimer, the term of this patent is extended or adjusted under 35 U.S.C. 154(b) by 112 days.

(21) Appl. No.: 17/071,532

(22) Filed: Oct. 15, 2020

(65) Prior Publication Data

US 2021/0111657 A1 Apr. 15, 2021

Related U.S. Application Data

(60) Provisional application No. 62/983,223, filed on Feb. 28, 2020, provisional application No. 62/915,418, filed on Oct. 15, 2019.

(51) Int. Cl.
*H02P 27/08* (2006.01)
*B60L 50/51* (2019.01)
(Continued)

(52) U.S. Cl.
CPC .............. *H02P 27/08* (2013.01); *B60L 15/08* (2013.01); *B60L 50/51* (2019.02);
(Continued)

(58) Field of Classification Search
CPC ...... H05B 47/19; H05B 45/10; H05B 47/195; H05B 45/3725; H05B 45/20;
(Continued)

(56) References Cited

U.S. PATENT DOCUMENTS 3,864,561 A 2/1975 Spira et al.
4,939,383 A * 7/1990 Tucker .................. H01C 10/50
338/200

(Continued)

FOREIGN PATENT DOCUMENTS

CN 202679717 U 1/2013
EP 3465711 A1 4/2019

*Primary Examiner* — Monica C King
(74) *Attorney, Agent, or Firm* — Flaster Greenberg, P.C.

(57) ABSTRACT

A wall-mountable load control device may include an illuminated rotary knob for providing a nightlight feature. The load control device may be configured to control an intensity of a lighting load. The load control device may include a yoke adapted to be mounted to an electrical wall box, an enclosure attached to the yoke, a faceplate attached to the yoke and having an opening, a mounting member attached to the yoke, and/or a potentiometer located within the enclosure and having a shaft extending through an opening in the yoke and the opening of the faceplate. The load control device may include a collar attached to the boss of the mounting member and surrounding the shaft of the potentiometer. The mounting member may be configured to conduct light from at least one light source housed within the enclosure to illuminate the faceplate.

24 Claims, 19 Drawing Sheets

(51) Int. Cl.
*B60L 15/08* (2006.01)
*G01R 19/165* (2006.01)
*H02M 7/5387* (2007.01)
*H02P 25/18* (2006.01)

(52) U.S. Cl.
CPC .. *G01R 19/16538* (2013.01); *H02M 7/53871* (2013.01); *H02P 25/184* (2013.01); *B60L 2220/54* (2013.01)

(58) Field of Classification Search
CPC .. H05B 45/375; H05B 45/325; H05B 47/115; H05B 47/16; H05B 47/105; H05B 45/357; H05B 45/38; H05B 45/00; H05B 45/37; H05B 45/385; H05B 47/11; H05B 47/125; H05B 45/395; H05B 39/08; H05B 47/24; H05B 45/12; H05B 47/28; H05B 39/085; H05B 47/175; H05B 47/10; H05B 41/3924; H05B 47/13; H05B 47/18; H05B 39/044; H05B 39/088; H05B 45/24; H05B 47/17; H05B 45/355; H05B 45/56; H05B 39/086; H05B 45/31; H05B 39/048; H05B 45/14; H05B 45/32; H05B 45/33; H05B 47/155; H05B 41/20; H05B 41/392; H05B 45/22; H05B 45/335; H05B 39/00; H05B 47/12; H05B 47/185; H05B 39/04; H05B 39/041; H05B 39/06; H05B 39/083; H05B 45/18; H05B 45/315; H05B 45/3577; H05B 45/58; H05B 45/60; H05B 47/165; H05B 47/20; H05B 47/25; H05B 47/26; H05B 2214/02; H05B 3/40; H05B 41/36; H05B 41/39; H05B 41/3922; H05B 45/28; H05B 45/3578; H05B 45/36; H05B 45/39; H05B 45/50; H01H 19/025; H01H 3/0213; H01H 19/14; H01H 23/02; H01H 19/54; H01H 23/14; H01H 2300/03; H01H 13/023; H01H 23/168; H01H 9/182; H01H 13/14; H01H 15/025; H01H 19/115; H01H 21/36; H01H 15/10; H01H 2239/07; H01H 47/22; H01H 9/56; H01H 13/00; H01H 13/20; H01H 19/03; H01H 2219/062; H01H 2231/052; H01H 23/025; H01H 3/161; H01H 9/02; H01H 9/181; H01H 9/52; H01H 1/36; H01H 13/58; H01H 15/04; H01H 19/11; H01H 2229/064; H01H 2239/038; H01H 23/146; H01H 23/205; H01H 25/065; H01H 3/08; H01H 3/12; H01H 3/46; F21V 23/0442; F21V 23/04; F21V 33/006; F21V 21/30; F21V 21/041; F21V 23/06; F21V 21/04; F21V 21/048; F21V 23/008; F21V 23/0471; F21V 13/14; F21V 17/02; F21V 21/002; F21V 21/005; F21V 21/0824; F21V 21/40; F21V 21/403; F21V 23/02; F21V 23/0435; F21V 5/046; F21V 7/0016; F21V 11/18; F21V 14/04; F21V 17/10; F21V 17/101; F21V 19/02; F21V 21/088; F21V 23/00; F21V 23/003; F21V 29/90; F21V 33/0004; F21V 33/0076; F21V 7/0008; F21V 7/04

See application file for complete search history.

(56) References Cited

U.S. PATENT DOCUMENTS

| | | | |
|---|---|---|---|
| 4,988,840 A * | 1/1991 | Carson | H01H 3/0213 |
| | | | 200/51.09 |
| 7,242,150 B2 | 7/2007 | DeJonge et al. | |
| 7,546,473 B2 | 6/2009 | Newman | |
| 7,837,344 B2 | 11/2010 | Altonen et al. | |
| 7,872,423 B2 | 1/2011 | Biery et al. | |
| 8,009,042 B2 | 8/2011 | Steiner et al. | |
| 8,330,638 B2 | 12/2012 | Altonen et al. | |
| 8,451,116 B2 | 5/2013 | Steiner et al. | |
| 8,664,881 B2 | 3/2014 | Newman, Jr. et al. | |
| 10,134,268 B2 * | 11/2018 | Dimberg | H02G 3/14 |
| 10,687,405 B2 * | 6/2020 | Spira | H05B 47/115 |
| 2008/0111491 A1 | 5/2008 | Spira | |
| 2014/0268630 A1 | 9/2014 | Samuels | |
| 2017/0125875 A1 | 5/2017 | Courtney et al. | |
| 2017/0354021 A1 | 12/2017 | Dimberg et al. | |
| 2017/0354022 A1 | 12/2017 | Dimberg et al. | |

* cited by examiner

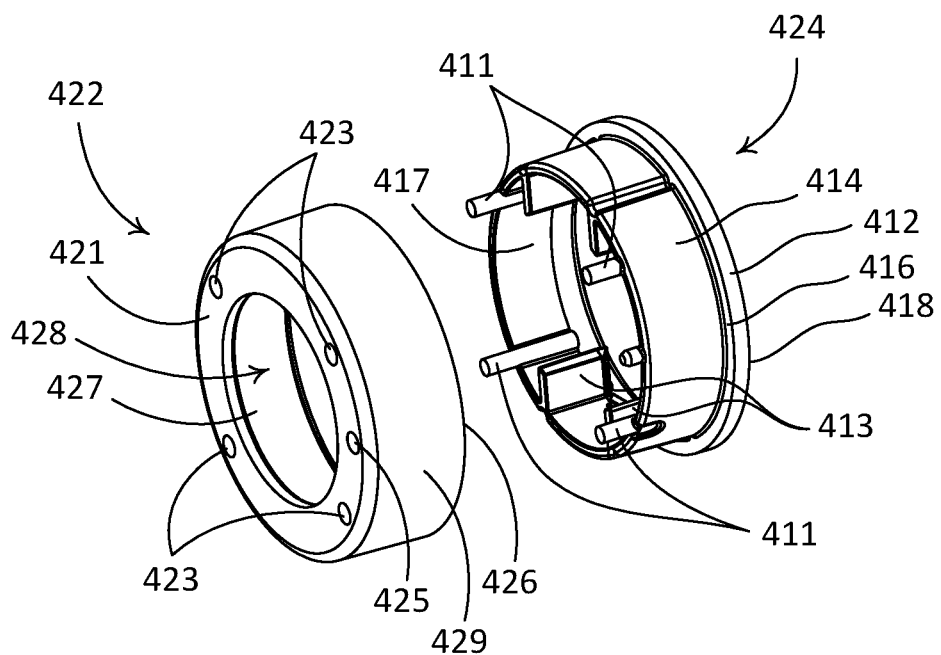
FIG. 16
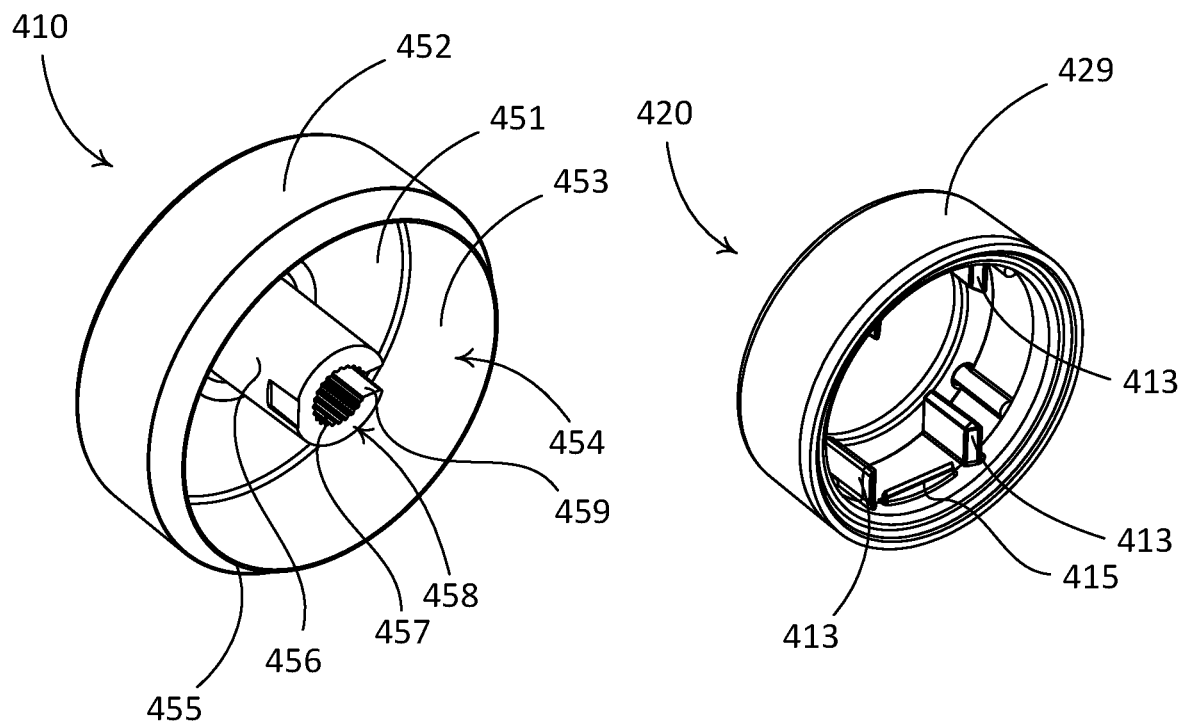
FIG. 17
FIG. 18

LOAD CONTROL DEVICE HAVING AN ILLUMINATED ROTARY KNOB

CROSS-REFERENCE TO RELATED APPLICATIONS

This application claims the benefit of Provisional U.S. Patent Application No. 62/915,418, filed Oct. 15, 2019; and Provisional U.S. Patent Application No. 62/983,223, filed Feb. 28, 2020, the disclosures of which are incorporated herein by reference in their entirety.

BACKGROUND

A conventional wall-mounted load control device may be mounted to a standard electrical wall box and may be coupled between a source of alternating-current (AC) power and an electrical load. Standard load control devices, such as dimmer switches and motor speed controls, use one or more semiconductor switches, such as triacs or field-effect transistors (FETs), to control the current delivered to the electrical load, and thus, an intensity of a lighting load and/or a speed of a motor. Wall-mounted load control devices typically include a user interface having controls for adjusting the intensity of the lighting load and/or the speed of the motor, such as a linear slider, a rotary knob, or a rocker switch. Some load control devices also include a button that allows for toggling of the load from off (e.g., no power is delivered to the load) to on (e.g., power is delivered to the load). Some load control devices also provide a night light that may be illuminated when the controlled load is off to allow a user to locate the load control device in a dark room.

SUMMARY

As disclosed herein, a wall-mountable load control device may comprise an illuminated rotary knob for providing a nightlight feature. The load control device may be configured to control an intensity of a lighting load. The load control device may comprise a yoke adapted to be mounted to an electrical wall box, an enclosure attached to the yoke, a faceplate attached to the yoke and having an opening, a mounting member attached to the yoke and having at least one boss extending through the opening of the faceplate, and a potentiometer located within the enclosure and having a shaft extending through an opening in the yoke and the opening of the faceplate. The rotary knob may have a planar surface and a circular sidewall extending from a periphery of the planar surface to form a cavity in the rotary knob. The rotary knob may comprise a shaft-attachment member located within the cavity and attached to the shaft of the potentiometer. The load control device may also comprise a collar attached to the boss of the mounting member and surrounding the shaft of the potentiometer. The mounting member may be configured to conduct light from at least one light source housed within the enclosure to illuminate the rotary knob.

BRIEF DESCRIPTION OF THE DRAWINGS

FIG. 16 is an exploded view of an example collar of the example control device shown in FIG. 10.

FIG. 17 is a rear perspective view of an example rotary knob of the example control device shown in FIG. 10.

FIG. 18 is a rear perspective view of the example collar shown in FIG. 16.

DETAILED DESCRIPTION

Figure 1:
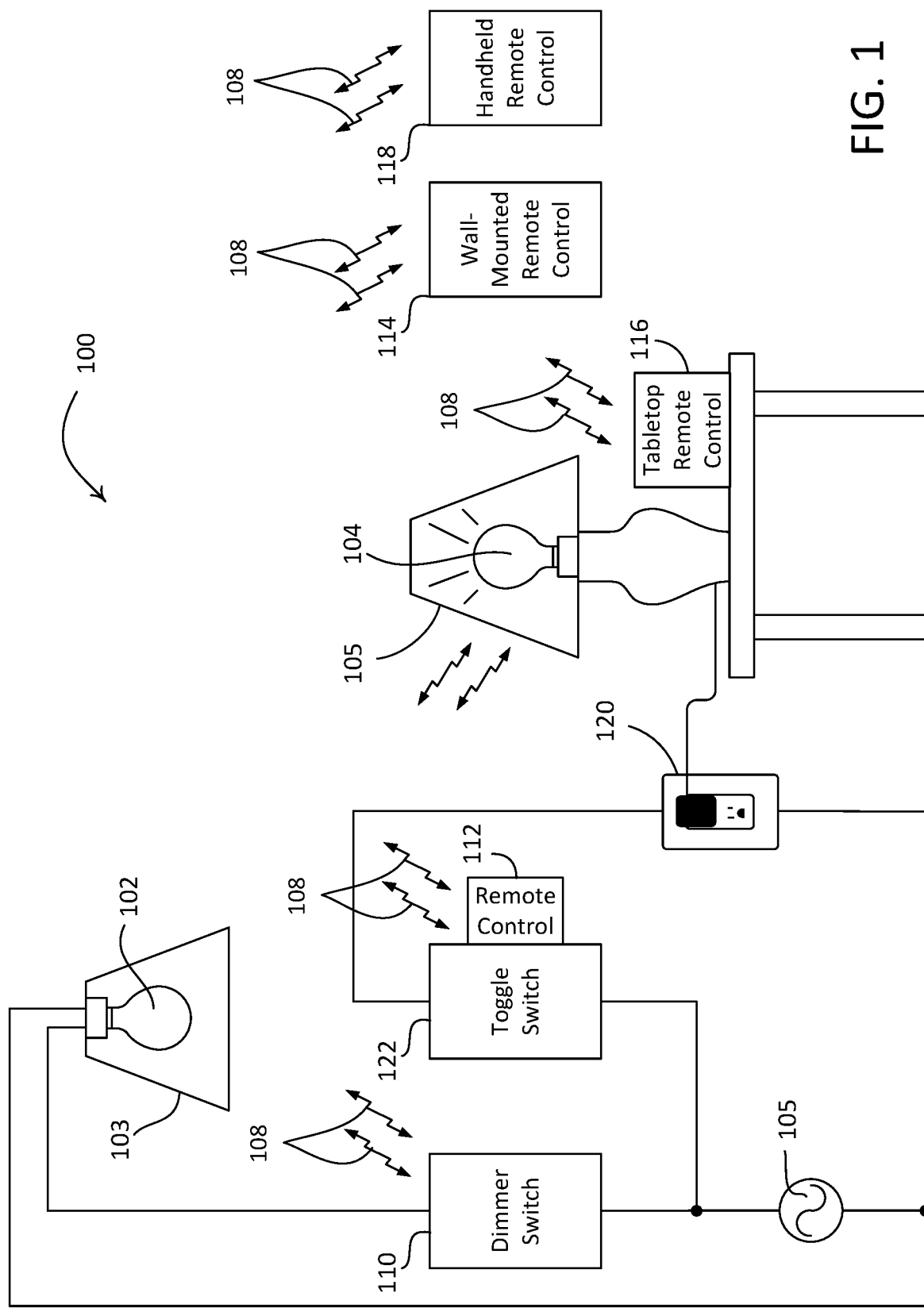
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command.

The lighting control system 100 may include one or more control devices for controlling the lighting loads 102, 104 (e.g., controlling an amount of power delivered to the lighting loads). The lighting loads 102, 104 may be controlled substantially in unison, or be controlled individually.

For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads so as to control an intensity of the lighting loads 102, 104 between a low-end intensity $L_{LE}$ and a high-end intensity $L_{HE}$, for example.

The control device described herein may be, for example, a dimmer switch 110, a retrofit remote control device 112, a wall-mounted control device 114, a tabletop remote control device 116, and/or a handheld remote control device 118. The dimmer switch 110 may be configured to be mounted to a standard electrical wallbox (e.g., via a yoke) and be coupled in series electrical connection between a power source (e.g., an alternating-current (AC) power source 105 or a direct-current (DC) power source) and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102 (e.g., the intensity and/or color of the lighting load), and generate respective control signals for executing the commands. Examples of wall-mounted dimmer switches are described in greater detail in commonly-assigned U.S. Pat. No. 7,546,473, issued Jun. 9, 2009, entitled DIMMER HAVING A MICROPROCESSORCONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122, a paddle switch, a pushbutton switch, a "light switch," or other suitable switch) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120. The retrofit remote control device 112 may be operable to transmit the wireless signals to the controllable light source 104 for controlling the intensity and/or color (e.g., color temperature) of the controllable light source 104.

The remote control device 112 may also be configured to transmit wireless signals for control of other electrical loads, such as for example, the volume of a speaker and/or audio system, the position of a motorized window treatment, the setpoint temperature of a heating and/or cooling system, and/or a controllable characteristic of another electrical load or device.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, the entire disclosure of which is hereby incorporated by reference.

The control devices described herein (e.g., the dimmer switch 110 and/or remote control devices 112-118) may each include one or more light sources (e.g., LEDs) configured to be illuminated to provide feedback to a user of the control device. Such feedback may indicate, for example, a status of the lighting loads 102, 104 such as whether the lighting loads are on or off, a present intensity of the lighting loads, and so on. The feedback may indicate a status of the control device itself such as a power status of the control device (e.g., remaining battery power). The feedback may indicate to the user that the control device is transmitting control signals (e.g., RF signals) in response to an actuation of the control device. The control device may be configured to keep the one or more light sources illuminated while the condition triggering the feedback continues to exist. The control device may be configured to illuminate the one or more light sources for a few seconds (e.g., 1-2 seconds) and then turn off the light sources (e.g., to conserve battery life).

The control devices may be configured to be dim (e.g., not illuminated) the one or more light sources so that no feedback is provided when the control devices are in an idle state. The control devices may then illuminate the one or more light sources to provide the feedback in response to detecting a user within close proximity of the control devices. Such detection may be based on, for example, a finger hovering near a front surface of the control devices. The presence of the user may be detected, for example, via a capacitive touch element or an electrical field sensor comprised in the control devices.

The control devices may each include a control circuit. The control circuit may be configured to be responsive to a user input and generate control data (e.g., a control signal) for controlling the lighting loads 102, 104 based on the user input. The control data may include commands and/or other information (e.g., such as identification information) for controlling the lighting loads 102, 104. The control circuit may be configured to illuminate the one or more light sources to provide the feedback described herein.

One or more of the control devices may include a wireless communication circuit (e.g., a radio frequency (RF) transmitter) operable to transmit and/or receive wireless signals such as RF signals 108. The wireless signal may be used to transmit control data (e.g., a digital message) generated by the control devices to the lighting loads 102, 104 or to a central controller of the lighting control system 100, for example. The lighting loads 102, 104 may be associated with a control device during a configuration procedure such that the lighting loads 102, 104 may be responsive to control signals transmitted by the control device. To illustrate, the association may be accomplished by actuating an actuator on the concerned lighting loads, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled RADIO-FREQUENCY LIGHTING CONTROL SYSTEM, the entire disclosure of which is hereby incorporated by reference.

The control devices may each include a memory. The memory may be used, for example, to store operational settings associated with the control device and/or the lighting loads 102, 104. The memory may be implemented as an external integrated circuit (IC) or as an internal circuit (e.g., as part of a control circuit).

The load control system 100 may include one or more of a remote occupancy sensor or a remote vacancy sensor (not shown) for detecting occupancy and/or vacancy conditions in a space surrounding the sensors. The occupancy or vacancy sensors may be configured to transmit digital messages to the lighting loads 102, 104 (e.g., via the RF signals 108) in response to detecting occupancy or vacancy conditions. Examples of RF load control systems having occupancy and vacancy sensors are described in greater detail in commonly-assigned U.S. Pat. No. 8,009,042, issued Aug. 30, 2011, entitled RADIO FREQUENCY LIGHTING CONTROL SYSTEM WITH OCCUPANCY SENSING, the entire disclosure of which is hereby incorporated by reference.

The load control system 100 may include a remote daylight sensor (not shown) for measuring a total light intensity in the space around the daylight sensor. The daylight sensor may be configured to transmit digital messages, such as a measured light intensity, to the lighting loads 102, 104 such that the lighting loads may be operable to adjust their respective intensities in response to the measured light intensity. Examples of RF load control systems having daylight sensors are described in greater detail in commonly assigned U.S. Pat. No. 8,451,116, issued May 28, 2013, entitled WIRELESS BATTERY-POWERED DAYLIGHT SENSOR, the entire disclosure of which is hereby incorporated by reference.

The load control system 100 may include other types of input devices, for example, radiometers, cloudy-day sensors, temperature sensors, humidity sensors, pressure sensors, smoke detectors, carbon monoxide detectors, air-quality sensors, security sensors, proximity sensors, fixture sensors, partition sensors, keypads, kinetic or solar-powered remote controls, key fobs, cell phones, smart phones, tablets, personal digital assistants, personal computers, laptops, time clocks, audio-visual controls, safety devices, power monitoring devices (such as power meters, energy meters, utility submeters, utility rate meters), central control transmitters, residential, commercial, or industrial controllers, or any combination of these input devices.

It should be further appreciated that although FIG. 1 depicts a load control system with two lighting loads, the system may include more lighting loads, other types of lighting loads, and/or other types of electrical loads. For example, the load control system may include one or more of the following: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; a volume control; an audio system or amplifier; an elevator; a power supply; a generator; an electric charger, such as an electric vehicle charger; an alternative energy controller; and/or the like.

Figure 2:
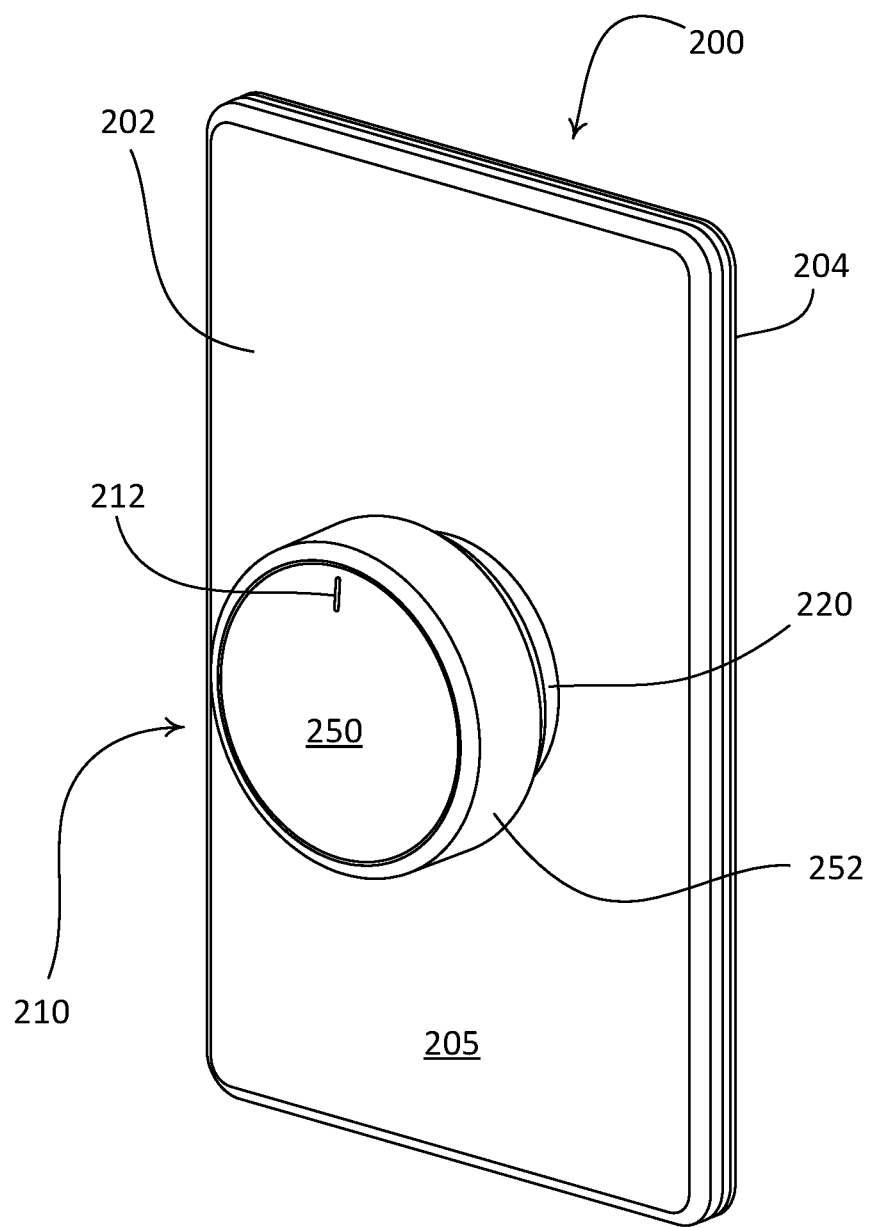
FIG. 2 is a perspective view of an example control device that may be deployed as a dimmer switch of the load control system illustrated in FIG. 1.
Figure 3:
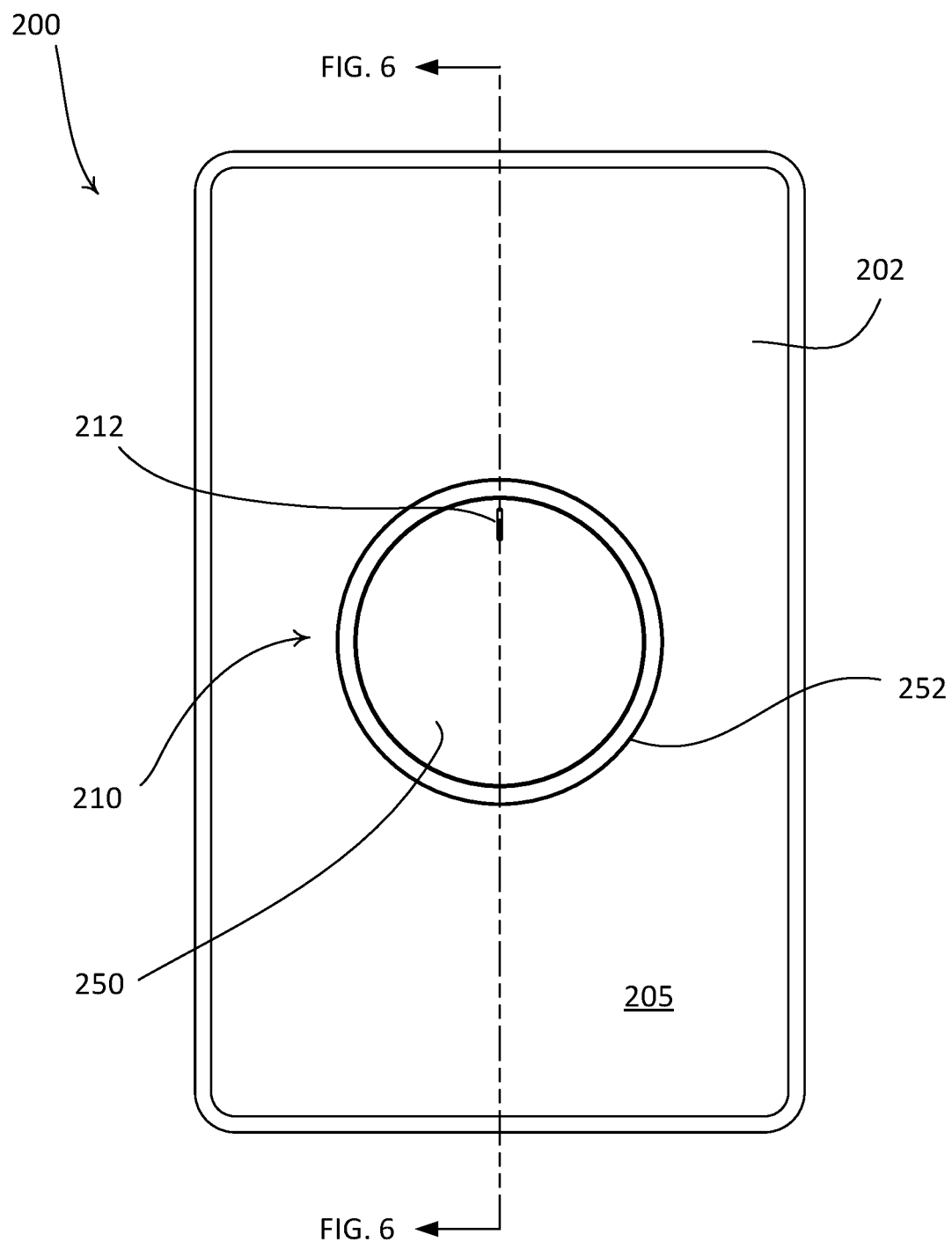
FIG. 3 is a front view of the example control device of FIG. 2.
Figure 4:
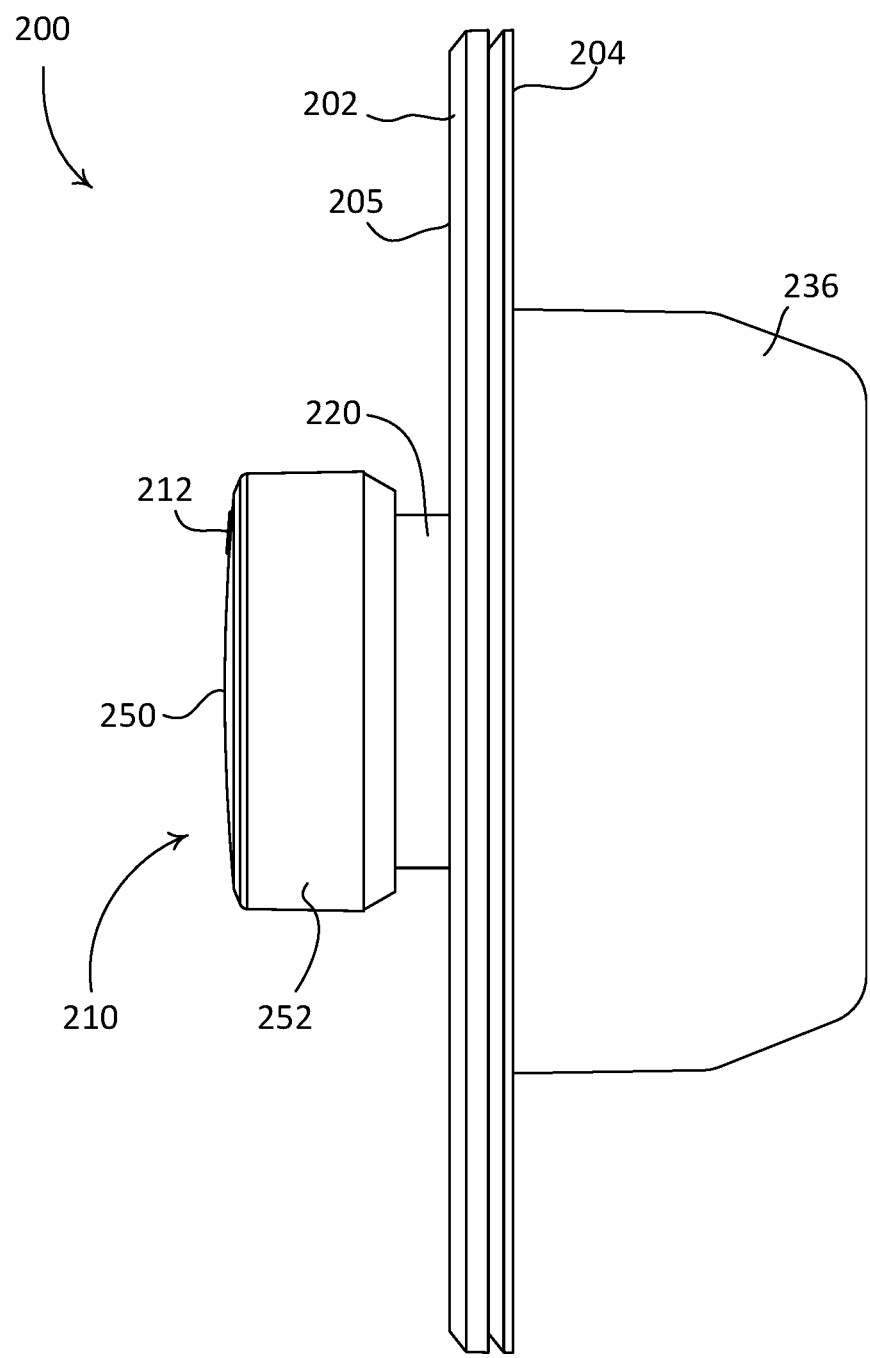
FIG. 4 is a right side view of the example control device of FIG. 2.

FIG. 2 is a perspective view, FIG. 3 is a front view, and FIG. 4 is a right side view of an example control device 200 that may be deployed as the dimmer switch 110 in the load control system 100. The dimmer switch 110 may be configured to control the amount of power delivered to, and thus the intensity of, at least one lighting load. The control device 200 may comprise a rotary knob 210 and a faceplate 202 mounted to an adapter plate 204. The control device 200 may be configured to turn the lighting load on and off in response to actuations of the rotary knob 210 that push the rotary knob 210 in towards the faceplate 202. The control device 200 may be configured to adjust the intensity of the lighting load in response to rotations of the rotary knob 210. The rotary knob 210 may comprise a visible indicator 212, which may indicate the intensity of the lighting load as the rotary knob 210 is rotated (e.g., based on the position of the visible indicator 212 within a full rotation of the rotary knob 210). The visible indicator may be illuminated, such that the position of the rotary knob 210 may be seen in a dark environment (e.g., when the lighting load is off). When the lighting load is off, the position of the visible indicator 212 may indicate the intensity to which the control device 200 will control the lighting load when the lighting load is turned on.

Figure 5:
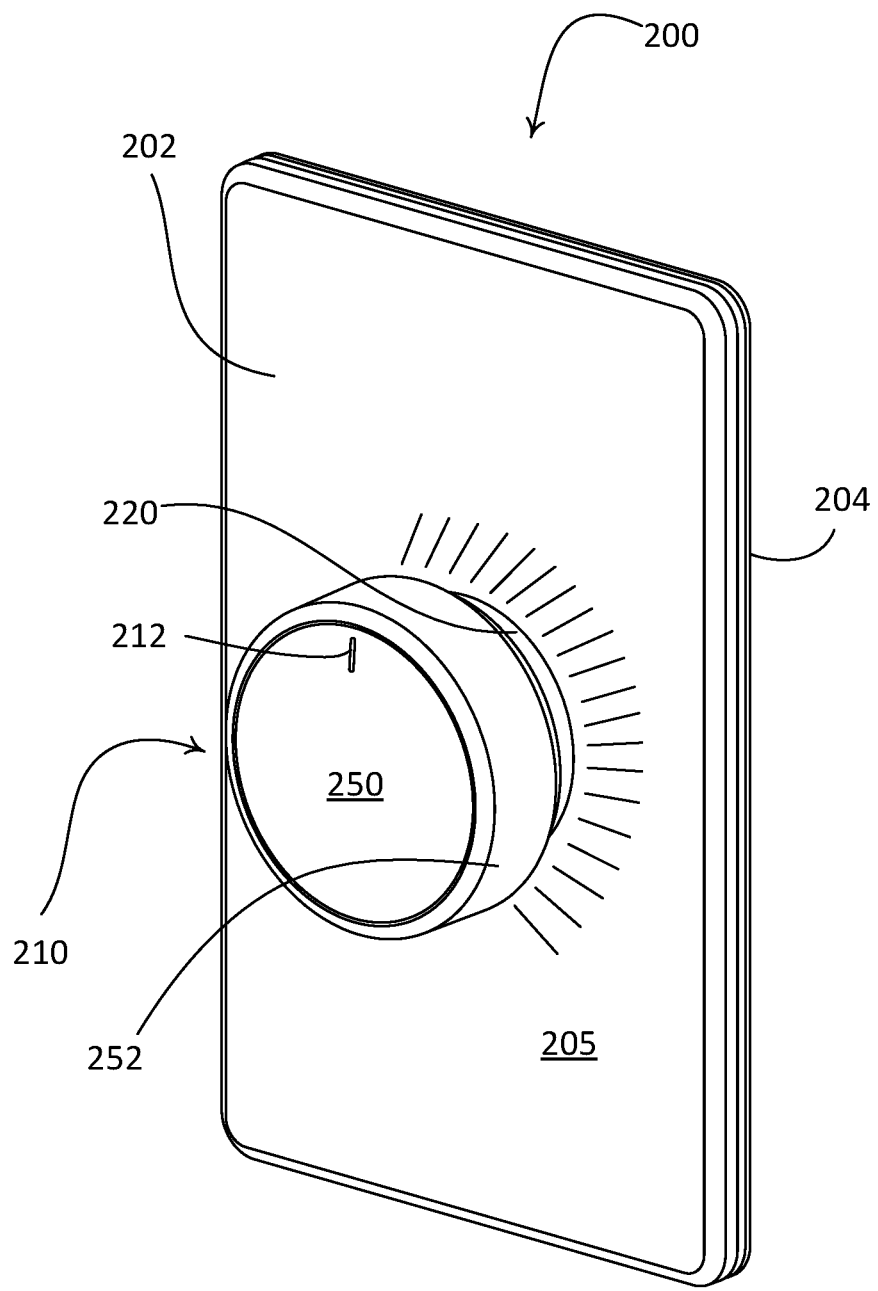
FIG. 5 is a perspective view of the example control device of FIG. 2 illustrating a night light feature of the control device.

The control device 200 may further comprise a collar 220 located between the rotary knob 210 and the faceplate 202. The control device 200 may be configured to provide a nightlight feature by shining light out the back of the rotary knob 210 (e.g., as shown in FIG. 5). For example, the collar 220 may be opaque and the control device 200 may be configured to shine light out the back of the rotary knob 210 and around the collar 220. In addition, the collar 220 may be translucent (e.g., diffusive) and may be configured to emit light. For example, the collar 220 may include a translucent portion (e.g., such as translucent portion 424 shown in FIGS. 10, 12, 13, 15, and 16) and an opaque portion (e.g., such as opaque portion 422 shown in FIGS. 10, 12, 13, 15, and 16) configured to direct the light to the translucent portion as described herein.

The control device 200 may adjust the intensity of light emitted from the back of the rotary knob 210 (e.g., the illumination of the nightlight feature) as a function of the present intensity of the lighting load (e.g., inversely proportional to the present intensity of the lighting load). For example, the control device 200 may increase the intensity of the nightlight illumination as the intensity of the lighting load is decreased, and vice versa. The control device 200 may control the intensity of the nightlight illumination to a maximum nightlight illumination when the lighting load is off. The control device 200 may turn the nightlight feature off, e.g., when the lighting load is at a maximum intensity.

Figure 6:
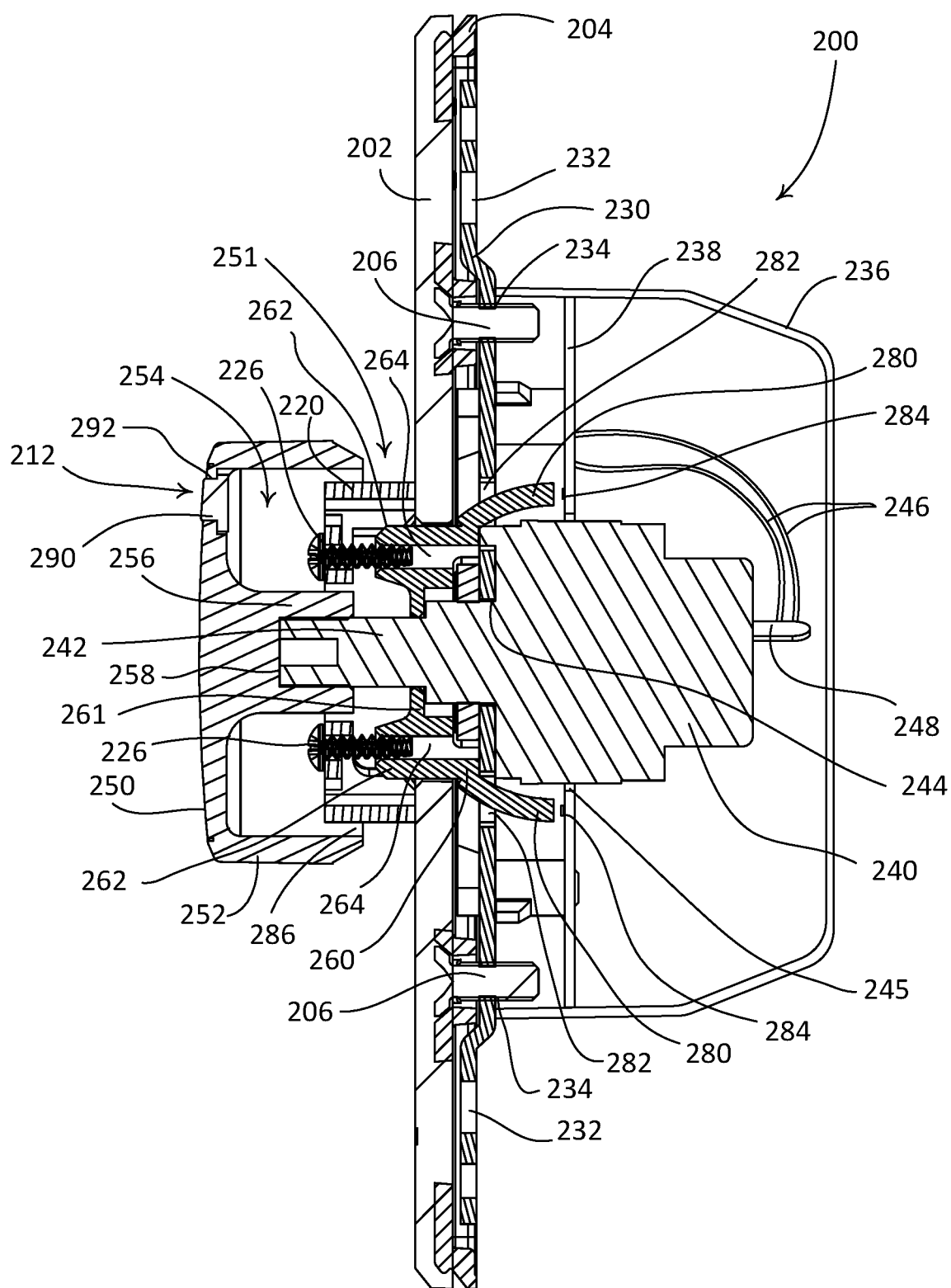
FIG. 6 is a right-side cross-sectional view of the example control device of FIG. 2 taken through the center of the control device (e.g., through the line shown in FIG. 3).

FIG. 6 is a right-side cross-sectional view of the control device 200 taken through the center of the control device 200 (e.g., through the line shown in FIG. 3). The control device 200 may comprise a yoke 230 that allows the control device 200 to be mounted to an electrical wall box via mounting screws (not shown) received though openings 232 in the yoke. The adapter plate 204 may be connected to the yoke 230 via faceplate screws 206 received through openings 234 in the yoke 230. The faceplate 202 may be configured to be snapped to the adapter plate 204. The control device 200 may comprise an enclosure 236 configured to house the electrical circuitry of the control device 200, which may be mounted to a printed circuit board 238.

The control device 200 may comprise a potentiometer 240 having a shaft 242 that extends through an opening 244 in the yoke 230. The potentiometer 240 (e.g., the shaft 242) may extend through an opening 245 in the printed circuit board 238. The potentiometer 240 (e.g., the shaft 242) may extend proximate to a middle portion of the printed circuit board 238. The potentiometer 240 may be electrically connected to the electrical circuitry on the printed circuit board 238 via electrical wires 246 connected to pins 248 of the potentiometer 240. The potentiometer 240 may provide a variable resistance between two or more of the pins 248 in response to rotations of the shaft 242. The rotary knob 210 may be coupled to the shaft 242 of the potentiometer 240, such that the control device 200 may determine how much to adjust the intensity of the lighting load in response to rotations of the rotary knob 210. The rotary knob 210 may define a circular planar surface 250 and a circular sidewall 252 that extend from the perimeter of the planar surface 250 to form a cavity 254 in the rear side of the rotary knob 210. The rotary knob 210 may also comprise a shaft-attachment member 256 located within the cavity 254 and having an opening 258 in which the shaft 242 of the potentiometer 240 may be received. For example, the rotary knob 210 may be pushed onto the shaft 242 of the potentiometer 240 to make a press-fit connection between the shaft 242 and the opening 258 of the shaft-attachment member 256. The collar 220 may be received within the cavity 254 of the rotary knob 210 and the sidewall 252 of the rotary knob 210 may move around the collar 220 as the rotary knob 210 is pushed in towards the faceplate 202 (e.g., to turn the lighting load on and off).

Figure 7:
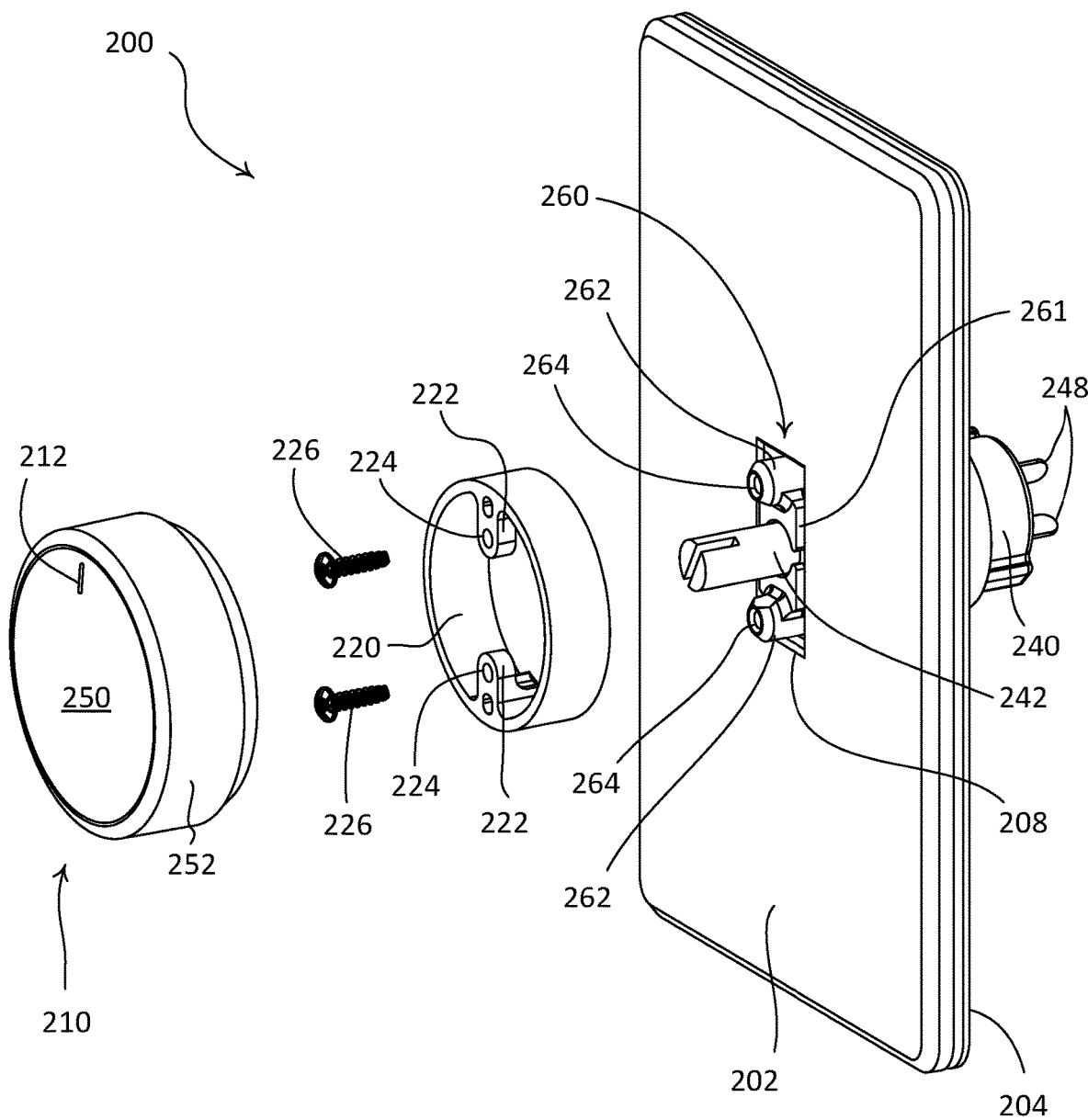
FIG. 7 is an exploded view of the example control device of FIG. 2 showing a rotary knob and a collar detached from a shaft of a potentiometer.

FIG. 7 is an exploded view of the control device 200 showing the rotary knob 210 and the collar 220 detached from the shaft 242 of the potentiometer 240. The shaft 242 may extend through an opening 208 of the faceplate 202. The control device 200 may also comprise a mounting member 260 that may also extend through the opening 208 of the faceplate 202 and may surround the shaft 242 of the potentiometer 240. The mounting member 260 may comprise an attachment portion 261 having bosses 262 that extend through the opening 208 of the faceplate 202 and protrude beyond a front surface 205 of the faceplate 202. The collar 220 may comprise tabs 222 having respective openings 224. The collar 220 may be attached to the mounting member 260 via respective screws 226 received through the openings 224 in the tabs 222 of the collar 220 and respective openings 264 in the bosses 262 of the mounting member 260. When the collar 220 is attached to the mounting member 260, the collar 220 may surround the shaft 242 of the potentiometer 240 and hide the shaft 242 from view of a user.

Figure 8:
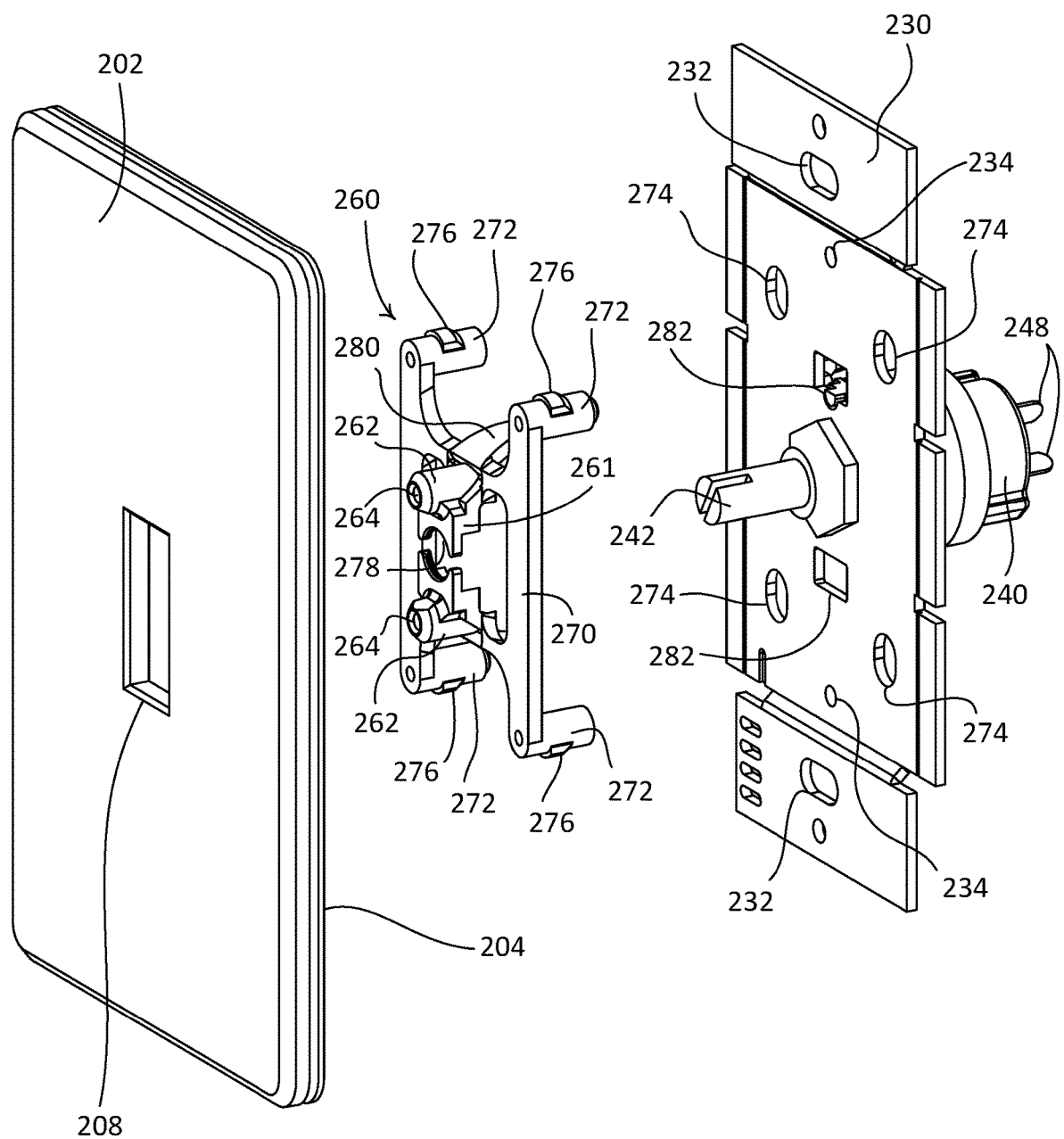
FIG. 8 is an exploded view of the example control device of FIG. 2 showing a faceplate, an adapter, and a mounting member detached from a yoke of the control device.

FIG. 8 is an exploded view of the control device 200 showing the faceplate 202, the adapter 204, and the mounting member 260 detached from the yoke 230 of the control device 200. The mounting member 260 may comprise a body 270 having a plurality of legs 272 (e.g., four legs as shown in FIG. 8). The legs 272 may be configured to be received in respective openings 274 in the yoke 230. For example, the legs 272 may each comprise a respective snap 276 configured to fixedly attach the mounting member 260 to the yoke 230. When the mounting member 260 is attached to the yoke 230, the shaft 242 of the potentiometer 240 may extend through a gap 278 formed in the mounting member 260.

The mounting member 260 may further comprise light pipe structures 280. As shown in FIG. 6, the light pipe structures 280 may extend through openings 282 in the yoke 230. The light pipe structures 280 may be configured to conduct light from one or more light sources inside of the control device 200 to the rotary knob 210 and/or the faceplate 202 (e.g., the front surface 205). For example, the light emitted by the one or more light sources is directed through a gap 251 between the rotary knob 210 and the faceplate 202, for example, to illuminate the front surface 205 of the faceplate 202. For example, the light may be conducted to the front surface 205 of the faceplate 202 via the light pipe structures 280. The light sources may comprise one or more light-emitting diodes (LEDs) 284 mounted to the printed circuit board 238 adjacent to respective ends of the light pipe structures 280 (e.g., as shown in FIG. 6). The light pipe structures 280 may extend from the printed circuit board 238 through the faceplate 202. The light pipe structures 280 may extend proximate to a top and a bottom, respectively, of the potentiometer 240 (e.g., the shaft 242). In addition, the light sources may comprise one or more neon lamps, for example, as described in greater detail in commonly-assigned U.S. Pat. No. 3,864,561, issued Feb. 4, 1975, entitled DIMMER SWITCH WITH ILLUMINATED KNOB, the entire disclosure of which is hereby incorporated by reference. For example, at least a portion of the mounting member 260

(e.g., the bosses 262 and/or the light pipe structures 280) may be made of a transparent and/or translucent material.

The mounting member 260 may be configured to conduct light emitted from the LEDs 284 through the respective light pipe structures 280 and through the respective bosses 262 to the cavity 254 of the rotary knob 210. For example, an inner surface of the cavity 254 of the rotary knob 210 may be reflective (e.g., painted white), and may be configured to reflect the light from the LEDs 284 back towards the front surface 205 of the faceplate 202. For example, the collar 220 may be made from an opaque material, and the light reflected off of the inner surface of the rotary knob 210 may shine through (e.g., ooze through) a gap 286 between the sidewall 252 of the rotary knob 210 and the collar 220. Additionally and/or alternatively, the collar 220 may be made from a transparent or translucent (e.g., diffuse) material, and may be configured to the conduct the light emitted by the LEDs 284 and emit the light around a perimeter of the collar 220. As previously mentioned, the intensity of the illumination of the nightlight feature may be adjusted as the present intensity of the lighting load is adjusted (e.g., inversely proportional to the present intensity of the lighting load). For example, the intensity of the nightlight illumination may increase as the intensity of the lighting load is decreased, and vice versa.

The visible indicator 212 on the rotary knob 210 may comprise an indicator light pipe 290 received in an opening in the planar surface 250 of the rotary knob 210. The indicator light pipe 290 may be configured to conduct light emitted by the LEDs 284 to the planar surface 250 of the rotary knob 210. The indicator light pipe 290 may collect and conduct light to the planar surface 250 of the rotary knob 210 as the rotary knob 210 is rotated (e.g., independent of the position of the rotary knob). The intensity of the illumination of the visible indicator 212 may be adjusted in a similar manner as the intensity of illumination of nightlight that is reflected onto the front surface 205 of the faceplate 202. The intensity of the illumination of the visible indicator 212 may be adjusted as the present intensity of the lighting load is adjusted (e.g., inversely proportional to the present intensity of the lighting load). For example, the intensity of the illumination of the visible indicator 212 may increase as the intensity of the lighting load is decreased, and vice versa.

The mounting member 260 may be attached to the yoke 230 of the control device 200 during manufacturing of the control device (e.g., prior to shipment from a manufacturer to a customer). To install the control device 200, the yoke 230 may first be mounted to the electrical wall box (e.g., via the mounting screws received through the openings 232). The adapter plate 204 may be mounted to the yoke 230 (e.g., via the faceplate screws 206 received through the openings 234), and the faceplate 202 may be snapped to the adapter plate 204. In addition, one-piece faceplate (not shown) may be attached to the yoke 230 (e.g., rather than the two-piece faceplate including the faceplate 202 and the adapter plate 204). The collar 220 may then be attached to the mounting member 260 that extends through the opening 208 of the faceplate 202 (e.g., via the screws 226). The rotary knob 210 may then be pushed onto the shaft 242 of the potentiometer 240 (e.g., to form the press-fit connection between the shaft 242 and the opening 258 of the shaft-attachment member 256).

Figure 9:
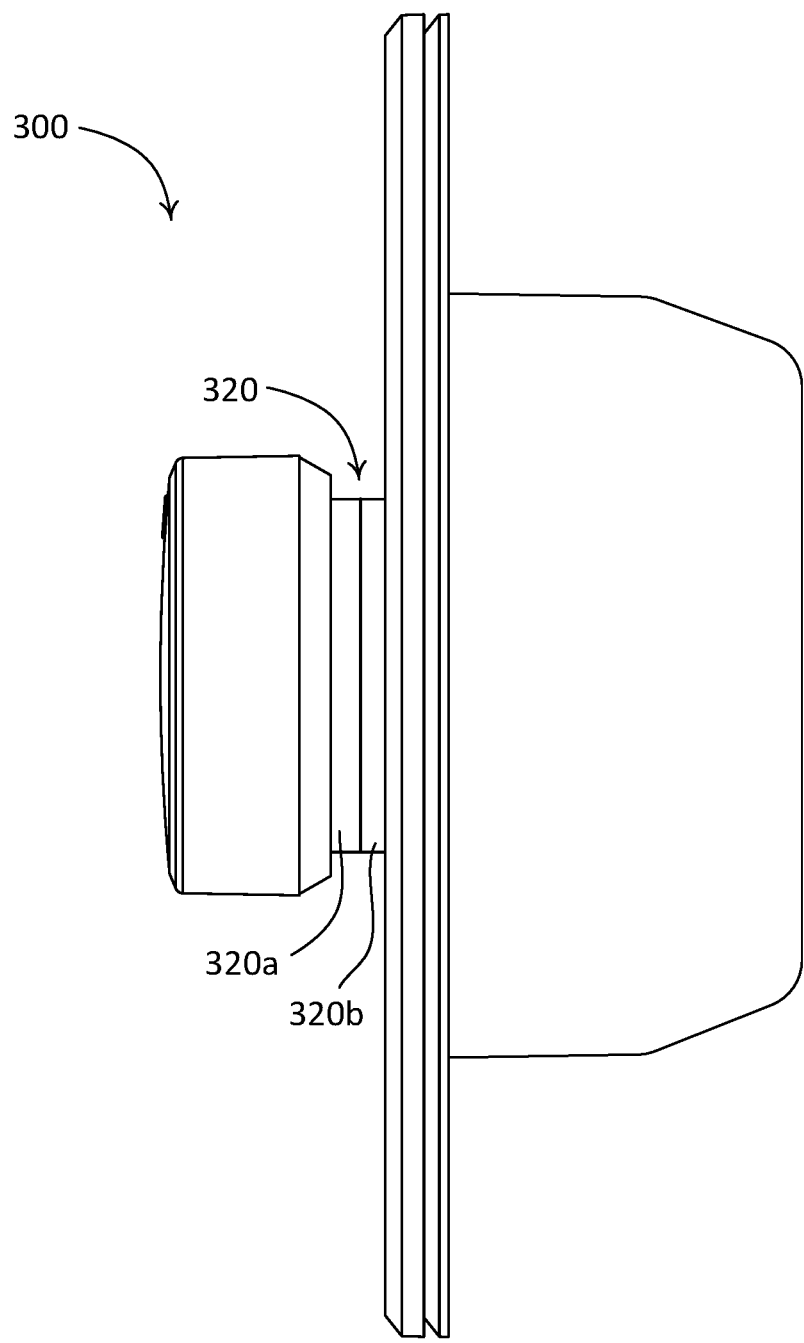
FIG. 9 is a right side view of another example control device that may be deployed as a dimmer switch of the load control system illustrated in FIG. 1.

FIG. 9 is a right side view of another control device 300 (e.g., that may be deployed as the dimmer switch 110 in the load control system 100). The control device 300 shown in FIG. 9 may have similar features as the control device 200. The control device 300 shown in FIG. 9 may comprise a two-part collar 320 having a front ring portion 320a and a rear ring portion 320b. The front ring portion 320a and the rear ring portion 320b may be made of different materials. For example, the front ring portion 320a may be made of an opaque material, while the rear ring portion 320b may be made from a transparent or translucent (e.g., diffusive) material and may emit light (e.g., as described for the control device 200).

FIGS. 10-21 depict another example control device 400 (e.g., that may be deployed as the dimmer switch 110 in the load control system 100). The control device 400 may be configured to control the amount of power delivered to, and thus the intensity of, at least one lighting load. The control device 400 may comprise a rotary knob 410 and a faceplate 402 mounted to an adapter plate 404. The control device 400 may include a collar 420 located between the rotary knob 410 and the faceplate 402. The control device 400 may be configured to turn the at least one lighting load on and off in response to actuations of the rotary knob 410 that push the rotary knob 410 in towards the faceplate 402. The control device 400 may be configured to adjust the intensity of the at least one lighting load in response to rotations of the rotary knob 410. The control device 400 may be configured to enable fade on and/or fade off of the at least one lighting load.

The control device 400 may include a yoke 430 that allows the control device 400 to be mounted to an electrical wall box via mounting screws (not shown) received though openings 432 in the yoke 430. The adapter plate 404 may be connected to the yoke 430 via faceplate screws 406 received through openings 434 in the yoke 430. The faceplate 402 may be configured to be attached (e.g., snapped) to the adapter plate 404. The control device 400 may include an enclosure 436 configured to house the electrical circuitry of the control device 400. The electrical circuitry of the control device 400 may be mounted to a printed circuit board 438.

The control device 400 may include a potentiometer 440 having a shaft 442 that extends through an opening 444 in the yoke 430. The shaft 442 may extend through an opening 408 of the faceplate 402. The control device 400 may include a mounting member 460. The potentiometer 440 may extend through an opening 445 in the printed circuit board 438. The potentiometer 440 may be electrically connected to the electrical circuitry on the printed circuit board 438 via electrical wires 446 connected to pins 448 of the potentiometer 440. The potentiometer 440 may provide a variable resistance between two or more of the pins 448 in response to rotations of the shaft 442. The rotary knob 410 may be coupled to the shaft 442 of the potentiometer 440, such that the control device 400 may determine how much to adjust the intensity of the lighting load in response to rotations of the rotary knob 410. The rotary knob 410 may define a front surface 450, a rear surface 451, and a circular sidewall 452. The circular sidewall 452 may extend from a perimeter of the front surface 450 to form a cavity 454 in the rear side of the rotary knob 410. The front surface 450 and/or the rear surface 451 may be circular planar surfaces.

The rotary knob 410 may include a shaft-attachment member 456. The shaft-attachment member 456 may be configured to engage the shaft 442 of the potentiometer 440. The shaft-attachment member 456 may extend from the rear surface 451 into the cavity 454. The shaft-attachment member 456 may include an opening 458 and a radial slit 459. The opening 458 may be a bore that is configured to receive a portion (e.g., distal portion) of the shaft 442 of the potentiometer 440. The shaft-attachment member 456 may include a plurality of internal splines 457 (e.g., within the opening). The plurality of internal splines 457 may be configured to engage corresponding features on the shaft 442 of the potentiometer 440. Alternatively, the plurality of internal splines 457 may be configured to engage a smooth outer surface of the shaft 442. For example, the shaft-attachment member 456 may be configured to operatively couple the rotary knob 410 (e.g., via the internal splines 457) to the potentiometer 440. For example, the rotary knob 410 may be pushed onto the shaft 442 of the potentiometer 440 to make a press-fit connection between the shaft 442 and the opening 458 of the shaft-attachment member 456. The slit 459 may be configured to enable the shaft-attachment member 456 to flex outward as the shaft 442 is pressed into the opening 458. The collar 420 may be received within the cavity 454 of the rotary knob 410 and the sidewall 452 of the rotary knob 410 may move around the collar 420 as the rotary knob 410 is pushed in towards the faceplate 402 (e.g., to turn the lighting load on and off).

The control device 400 may include a mounting member 460. The mounting member 460 may be configured to secure the collar 420 thereto, for example, without the use of tools. A portion of the mounting member 460 may extend through the opening 408 of the faceplate 402. The mounting member 460 may include an attachment portion 461 comprising compliant members 462 that are configured to extend through the opening 408 of the faceplate 402. The compliant members 462 may extend through an opening 482 in the yoke 430. The compliant members 462 may be a distance D1 from an edge of the opening 482. The compliant members 462 may extend on opposed sides of the shaft 442 of the potentiometer 440. For example, the compliant members 462 may be spaced apart approximately 180 degrees, axially with respect to the shaft 442 of the potentiometer 440. It should be appreciated that although the figures depict the compliant members 462 in a vertical arrangement above and below (e.g., at 0 and 180 degrees) the shaft 442 of the potentiometer 440, the compliant members 462 may be located at other locations (e.g., such as a horizontal arrangement to the right and left, or 90 and 270 degrees, respectively) around the shaft 442 of the potentiometer 440.

Figure 19:
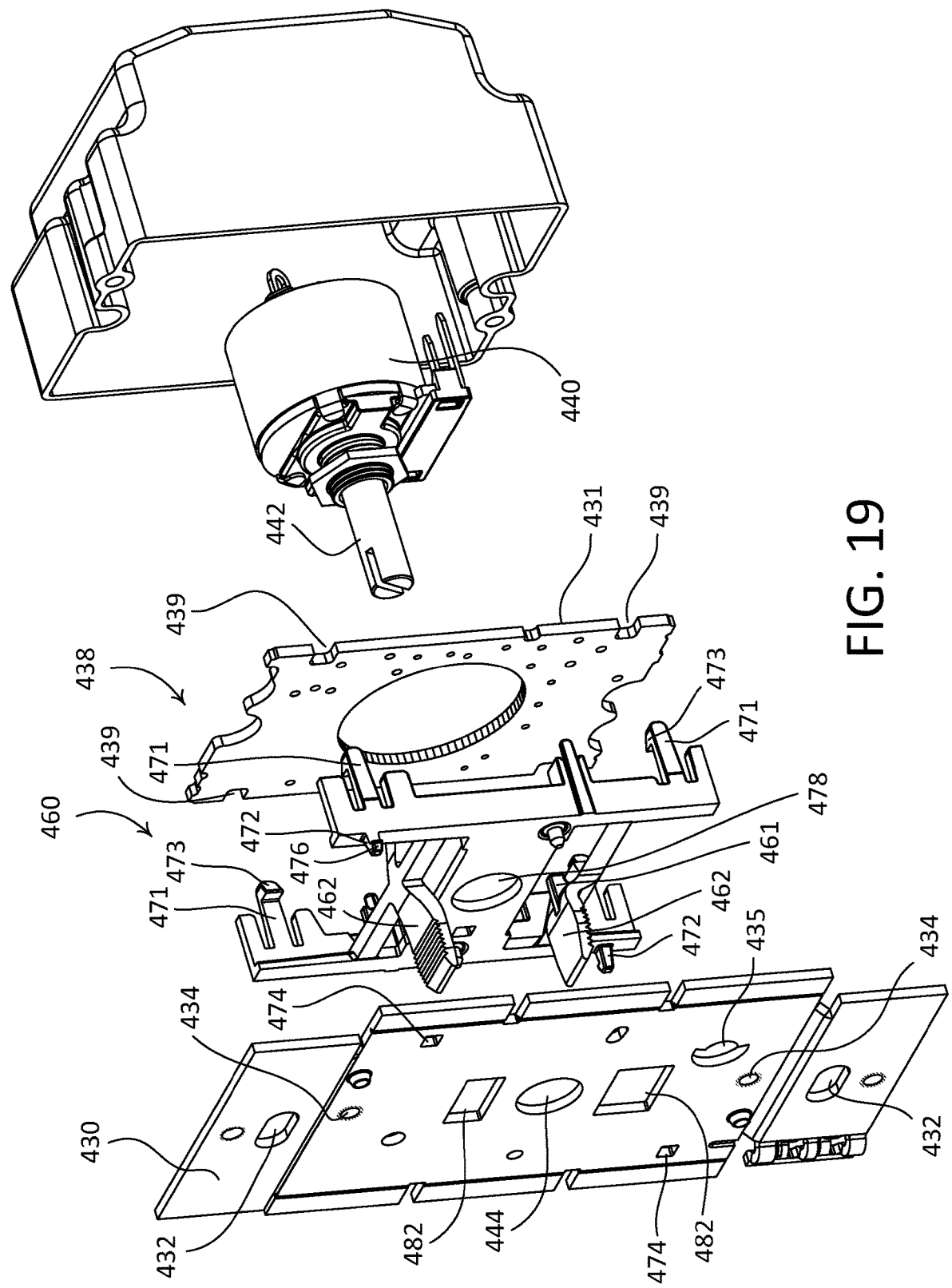
FIG. 19 is an exploded view of the example control device shown in FIG. 10.

The compliant members 462 may be configured to removably secure the collar 420 to the mounting member 460. For example, the compliant members 462 may be configured to protrude beyond a front surface 405 of the faceplate 402. When the compliant members 462 protrude beyond the front surface 405, the compliant members 462 (e.g., distal portions of the compliant members 462) may be received within a cavity 428 of the collar 420. Each of the compliant members 462 may define a ratcheting surface 464. The ratcheting surface 464 may include a plurality of teeth 465. The ratcheting surface 464 of each of the compliant members 462 may be distal from (e.g., facing away from) the shaft 442 of the potentiometer 440. Each of the compliant members 462 may include a stop 461 (e.g., as shown in FIG. 19). The stop 461 may be configured to abut the yoke 430 at the respective opening 482 when a vertical force (e.g., greater than a threshold force) is applied to the collar 420 (e.g., via the rotary knob 410). For example, when the vertical force is applied to the collar 420, the distance D1 may increase or decrease (e.g., based on a direction of the vertical force) an amount that is proportional to the amount of force applied.

Figure 21:
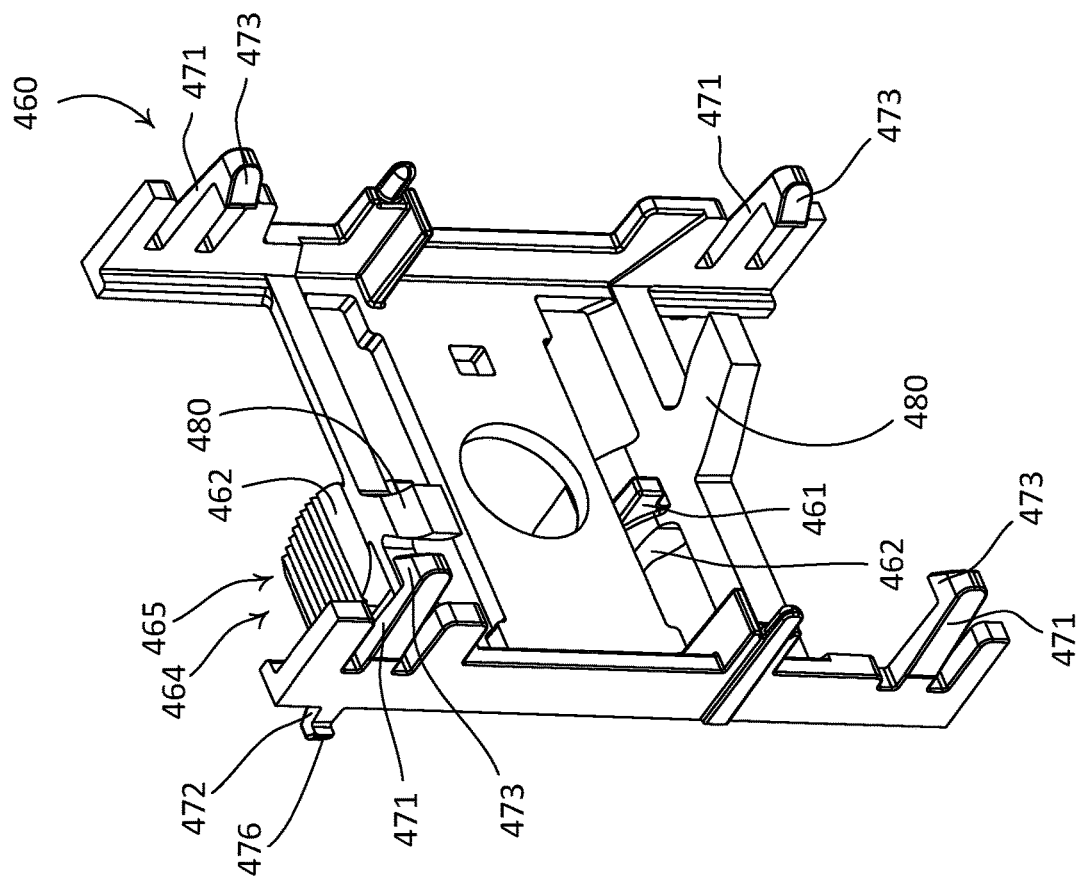
FIG. 21 is a rear perspective view of the example mounting member shown in FIG. 20.
Figure 20:
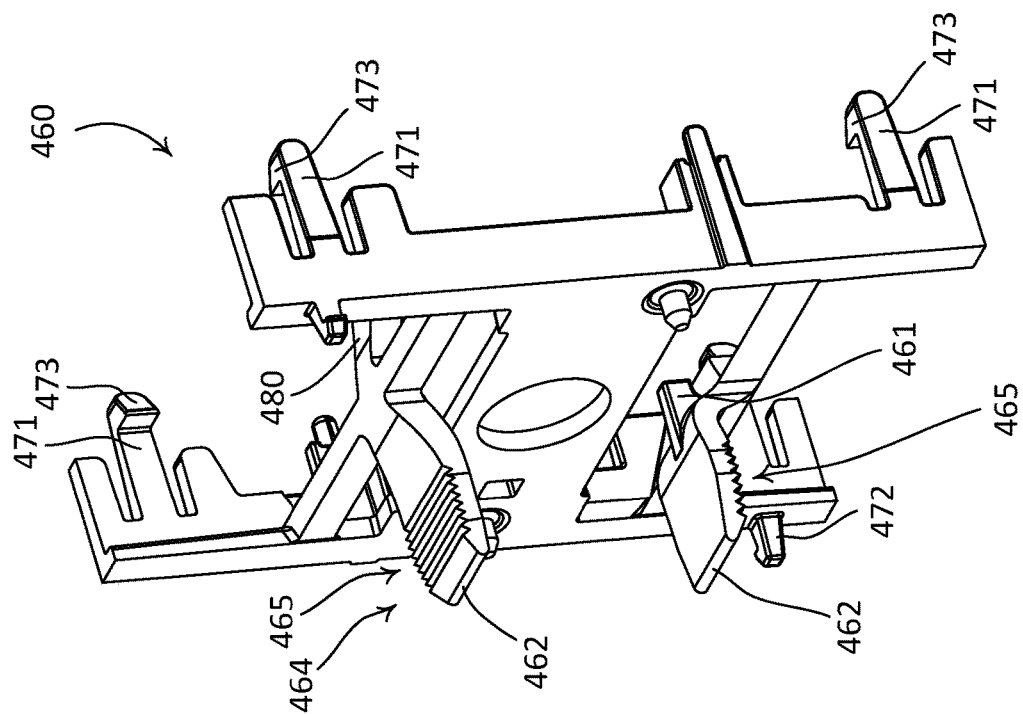
FIG. 20 is a front perspective view of an example mounting member of the example control device shown in FIG. 10.

The mounting member 460 may include a plurality of legs 472 (e.g., two legs as shown in FIGS. 19-21). The legs 472 may be configured to be received in respective openings 474 in the yoke 430. For example, each of the legs 472 may include a respective snap 476 configured to attach (e.g., fixedly attach) the mounting member 460 to the yoke 430. When the mounting member 460 is attached to the yoke 430, the shaft 442 of the potentiometer 440 may extend through a gap 478 formed in the mounting member 460.

The mounting member 460 may include a plurality of arms 471 (e.g., four arms as shown in FIGS. 19-21). The arms 471 may be configured to removably attach the mounting member 460 to the PCB 438. The arms 471 may be configured to be received in respective notches 439 in the PCB 438. For example, each of the arms 471 may include a respective snap 473 configured to attach (e.g., fixedly attach) the mounting member 460 to the PCB 438. The respective snaps 473 may engage a rear surface 431 of the PCB 438 when the mounting member 460 is attached to the PCB 438.

Figure 13:
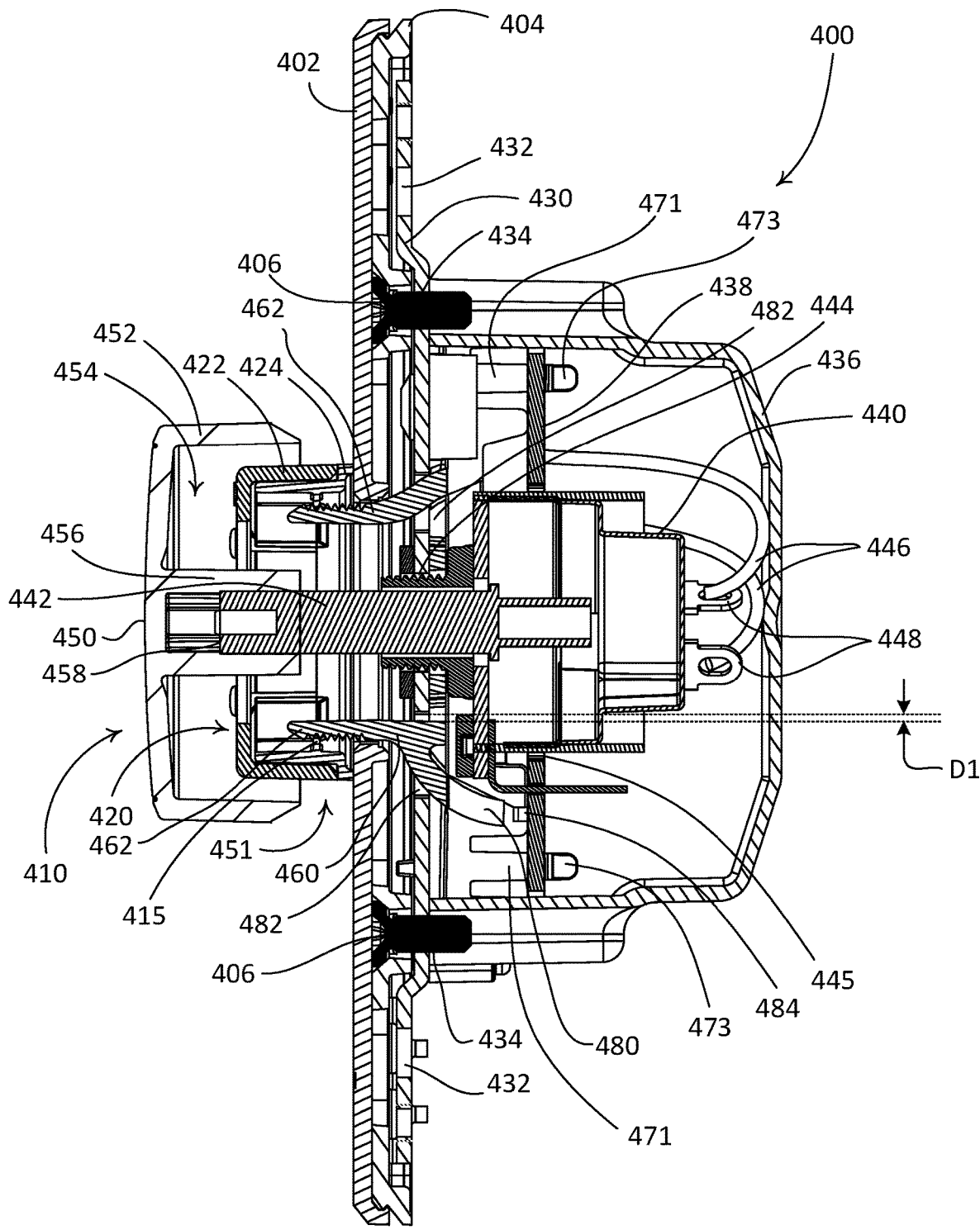
FIG. 13 is a right side cross-sectional view of the example control device of FIG. 10 taken through the center of the control device (e.g., through the line shown in FIG. 11).

The mounting member 460 may include one or more light pipe structures 480. As shown in FIG. 21, the light pipe structures 480 may extend through openings 482 in the yoke 430. For example, the light pipe structures 480 may be connected to the compliant members 462. The light pipe structures 480 may be configured to conduct light from one or more light sources inside of the control device to the rotary knob 410 and/or the faceplate 402 (e.g., the front surface 405). For example, the light emitted by the one or more light sources is directed through a gap 451 between the rotary knob 410 and the faceplate 402, for example, to illuminate the front surface 405 of the faceplate 402. For example, the light may be conducted to the front surface 405 of the faceplate 402 via the light pipe structures 480. The light sources may include one or more light-emitting diodes (LEDs) 484 mounted to the printed circuit board 438 adjacent to respective ends of the light pipe structures 480 (e.g., as shown in FIG. 13). The light pipe structures 480 may extend from the printed circuit board 438 through the faceplate 402. The light pipe structures 480 may extend proximate to a top and a bottom, respectively, of the potentiometer 440 (e.g., the shaft 442). In addition, the light sources may include one or more neon lamps, for example, as described in greater detail in previously-referenced U.S. Pat. No. 3,864,561. For example, at least a portion of the mounting member 460 (e.g., the compliant members 462 and/or the light pipe structures 480) may be made of a transparent and/or translucent material.

The mounting member 460 may be configured to conduct light emitted from the LEDs 484 through the respective light pipe structures 480 and through the respective compliant members 462 to an interior of the collar 420. The light pipe structures 480 may be configured to conduct the light emitted from the LEDs 484 onto the front surface 405 of the faceplate 402 and/or to a visible indicator (e.g., such as the visible indicator 212 shown in FIGS. 3-5 and 7) on the rotary knob 410. At least a portion of the collar 420 (e.g., a translucent skirt 424) may be made from a transparent or translucent (e.g., diffuse) material, and may be configured to the conduct the light emitted by the LEDs 284 and emit the light around a perimeter of the collar 420. Another portion of the collar 420 (e.g., an opaque ring 422) may be made from an opaque material, and may be configured to prevent the light emitted by the LEDs 284 from passing through the opaque ring 422. For example, the opaque ring 422 may be configured to direct the light from the LEDs 284 through the translucent skirt 424 and towards the front surface 405 of the faceplate 402. Alternatively or additionally, the collar 420 may be configured to enable illumination of a visible indicator (e.g., such as the visible indicator 212 shown in FIGS. 2-7) on the front surface 450 of the rotary knob 410. In examples, the entire collar 420 may be transparent or translucent (e.g., the opaque ring 422 may be omitted). In examples, a front surface 421 of the collar 420 may define a cutout, a light pipe, and/or a transparent or translucent area proximate to the visible indicator on the rotary knob 410.

An intensity of the light emitted by the LEDs 484 (e.g., illumination of a nightlight feature) may be adjusted. For example the intensity of the light emitted by the LEDs 484 may be adjusted based on an intensity to which the lighting load is adjusted (e.g., inversely proportional to a present intensity of the lighting load). For example, the intensity of the nightlight illumination may increase as the intensity of the lighting load is decreased, and vice versa. The intensity of the light emitted by the LEDs 484 may be adjusted based on an amount of ambient light detected.

The mounting member 460 may be attached to the yoke 430 of the control device 400 during manufacturing of the control device 400 (e.g., prior to shipment from a manufacturer to a customer). To install the control device 400, the yoke 430 may first be mounted to the electrical wall box (e.g., via the mounting screws received through the openings 432). The adapter plate 404 may be mounted to the yoke 430 (e.g., via the faceplate screws 406 received through the openings 434), and the faceplate 402 may be snapped to the adapter plate 404. In addition, a one-piece faceplate (not shown) may be attached to the yoke 430 (e.g., rather than the two-piece faceplate including the faceplate 402 and the adapter plate 404). The collar 420 may then be attached to the mounting member 460 (e.g., the compliant members 462 that extend through the opening 408 of the faceplate 402. The rotary knob 410 may then be pushed onto the shaft 442 of the potentiometer 440 (e.g., to form the press-fit connection between the shaft 442 and the opening 458 of the shaft-attachment member 456).

The yoke 430 may include an aperture 435. The aperture 435 may be configured to receive a trim level adjuster 437. The trim level adjuster 437 may be configured to adjust a low-end and/or a high-end trim level for the control device 400.

It should be appreciated that the mounting member 460 may include one or more cantilevered beams (not shown) that are configured to reduce play in the shaft 442 of the potentiometer 440. For example, the one or more cantilevered beams may extend through the yoke 430 (e.g., such as through openings 482) such that distal portions of the beams are proximate to the shaft 442. When a vertical and/or horizontal force is applied to the shaft 442, the shaft 442 may abut one or more of the cantilevered beams to prevent further movement (e.g., radial movement) of the shaft 442.

Figure 10:
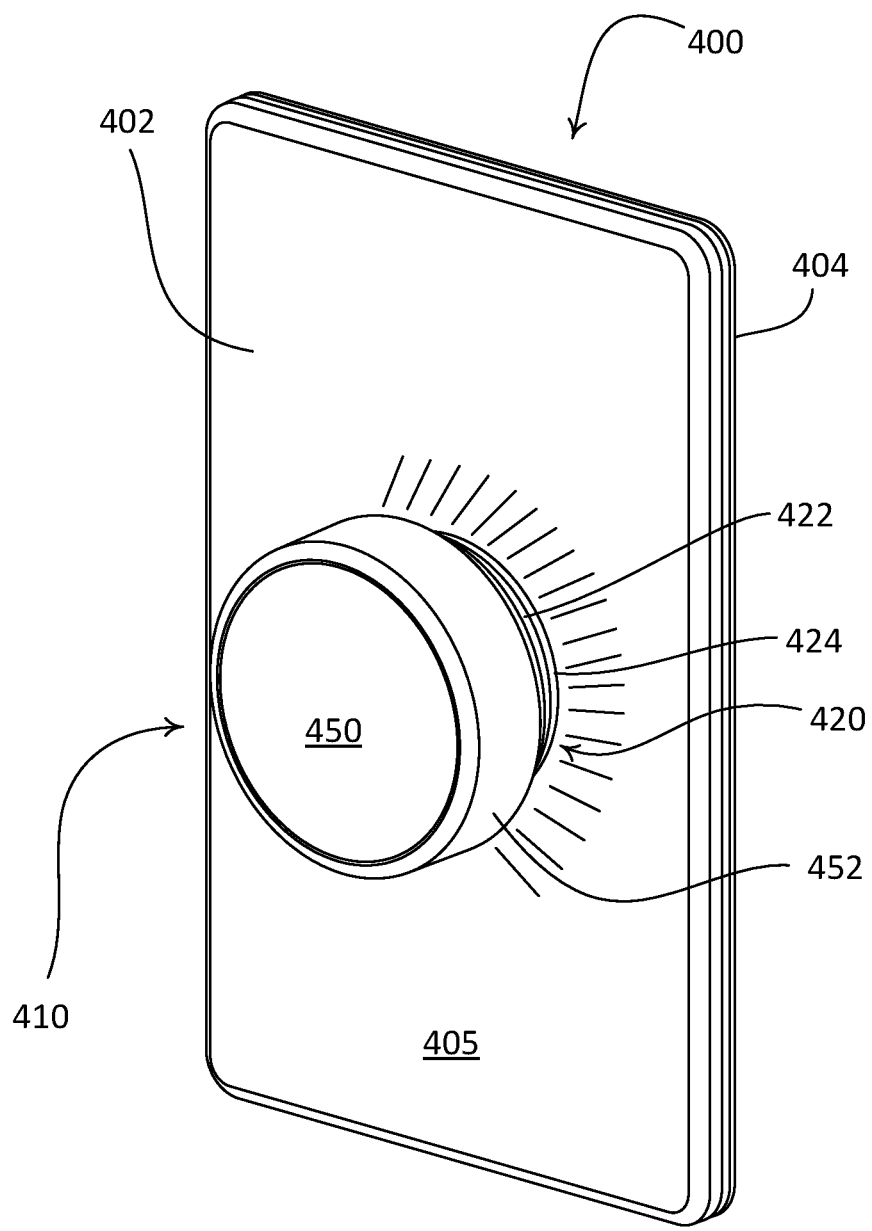
FIG. 10 is a front perspective view of another example control device that may be deployed as a dimmer switch of the load control system illustrated in FIG. 1.
Figure 11:
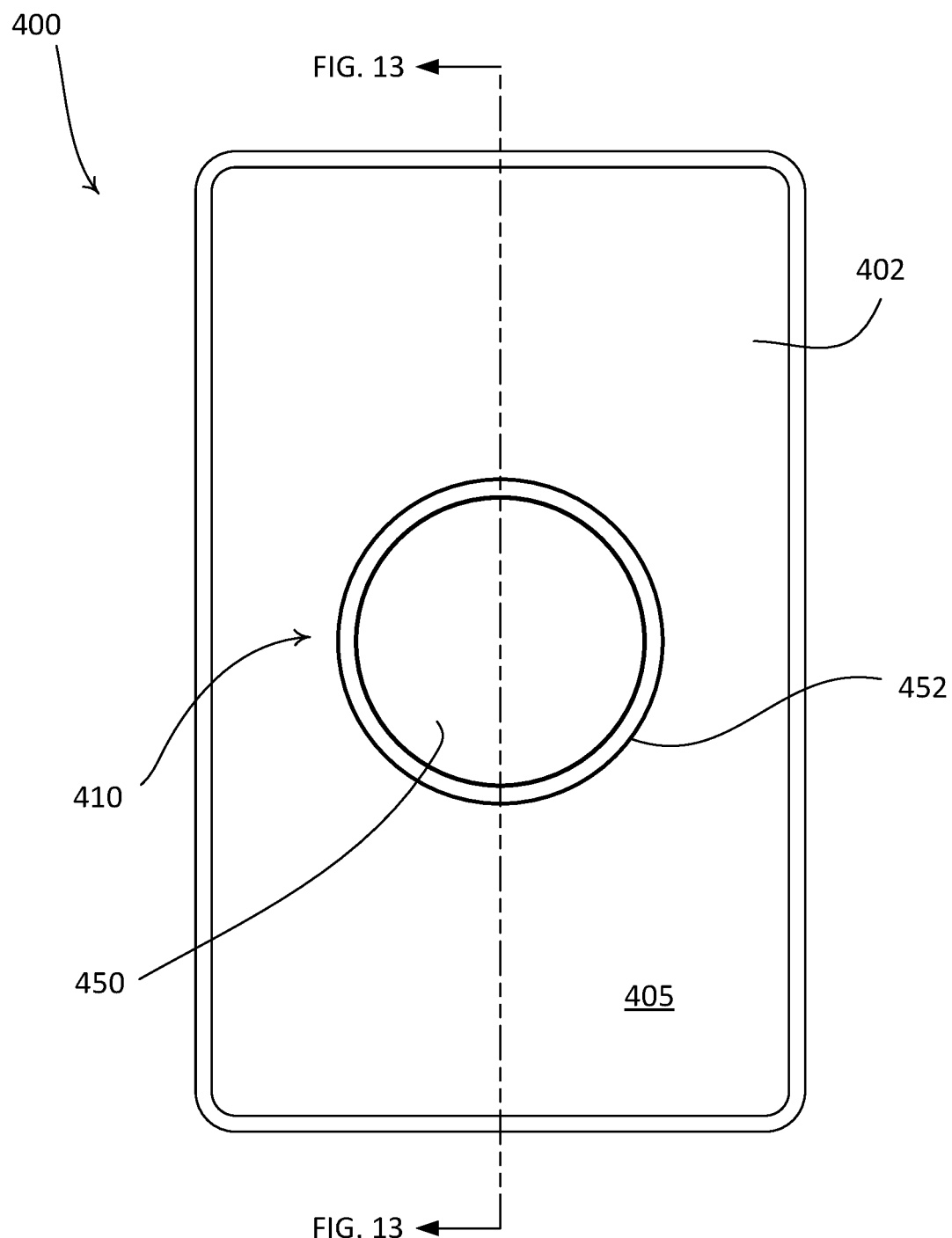
FIG. 11 is a front view of the example control device shown in FIG. 10.
Figure 12:
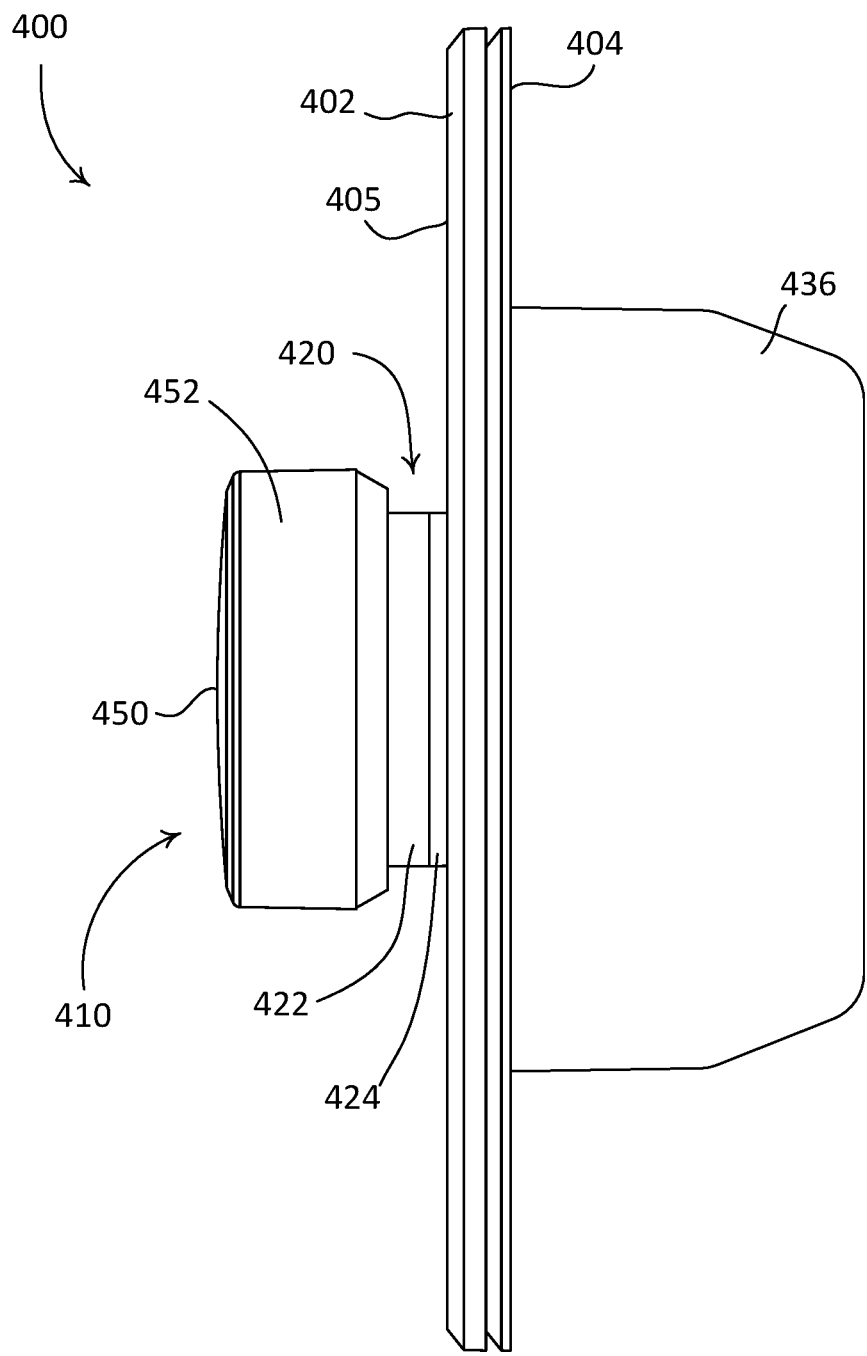
FIG. 12 is a right side view of the example control device shown in FIG. 10.

The control device 400 may be configured to provide a nightlight feature by shining light out of the collar 420. For example, light may be emitted through the collar 420 between a back edge 455 of the rotary knob 410 and the faceplate 402 (e.g., as shown in FIG. 10). For example, the collar 420 may include an opaque portion (e.g., the opaque ring 422) and a translucent portion (e.g., the translucent skirt 424). The translucent portion may be configured to be received within the opaque portion. For example, the opaque ring 422 may receive the translucent skirt 424. The translucent skirt 424 may be configured to emit light onto a portion of the faceplate 402. The portion of the faceplate 402 may include an area on the front surface 408 surrounding the rotary knob 410. For example, the control device 400 may adjust the intensity of the illumination of the nightlight feature as a function of the present intensity of the lighting load (e.g., inversely proportional to the present intensity of the lighting load). For example, the control device 400 may increase the intensity of the nightlight illumination as the intensity of the lighting load is decreased, and vice versa.

The control device 400 may control the intensity of the nightlight illumination to a maximum nightlight illumination when the lighting load is off. The control device 400 may turn the nightlight feature off, e.g., when the lighting load is at a maximum intensity.

The translucent skirt 424 may be configured to enable light emitted by the LEDs 484 to shine on the faceplate 402. The translucent skirt 424 of the collar 420 may include a shoulder 412 that defines a front surface 416 and a rear surface 418. The shoulder 412 may be translucent. The translucent skirt 424 may include a cylindrical shell 414 that extends from the shoulder 412 (e.g., the front surface 416). The cylindrical shell 414 may define an inner surface 417. The cylindrical shell 414 may be translucent. A portion of the cylindrical shell 414 may be opaque, for example, to further direct the light emitted by the LEDs 484 toward the faceplate 402.

The collar 420 may be configured to attach to the mounting member 460. For example, the collar 420 may be configured to attach to the mounting member 460 via the ratcheting surfaces 464 of the compliant members 462 such that the collar 420 surrounds the shaft 442 of the potentiometer 440. The translucent skirt 424 may be substantially flush with the faceplate when the collar 420 is attached to the mounting member 460. The translucent skirt 424 may include one or more tabs 415 (e.g., two tabs as shown in FIG. 13). The one or more tabs 415 may be configured as a pawl in a ratchet function of the control device 400. The one or more tabs 415 may extend from the inner surface 417 of the cylindrical shell 414. For example, the translucent skirt 424 may include two tabs 415 that are at opposite sides of the cylindrical shell 414. The two tabs 415 may be located 180 degrees from one another. The collar 420 may be attached to the mounting member 460 via engagement of the two tabs 415 with respective ratcheting surfaces 464 of the compliant members 462. For example, each of the tabs 415 may be configured to abut a respective one of the compliant members 462 such that the tabs 415 engage with (e.g., are located between) adjacent teeth of the plurality of teeth 465. The adjacent teeth of the plurality of teeth 465 may include a first tooth and a second tooth such that the tabs 415 are configured to rest between the first tooth and the second tooth. When the tabs 415 are engaged with adjacent teeth of the plurality of teeth 465, the tabs 415 and the adjacent teeth may resist movement of the collar 420 toward and/or away from the faceplate 402. For example, the tabs 415 and the adjacent teeth may resist up to a threshold force applied to the collar 420 (e.g., in a direction perpendicular to the faceplate 402). When a force greater than the threshold force is applied to the collar 420, the tabs 415 may move from between the first tooth and the second tooth to between the second tooth and a third tooth. As the collar 420 is pressed toward the faceplate 402, the tabs 415 move into engagement with successive teeth of the plurality of teeth 465, for example, until the rear surface 418 of the skirt 424 abuts the front surface 405 of the faceplate 402. The collar 420 and the plurality of teeth 465 may be configured such that the collar 420 moves approximately 0.02 inches between successive teeth (e.g., per ratchet) of the plurality of teeth 465. When the rear surface 418 of the skirt 424 abuts the front surface 405 of the faceplate 402, the collar 420 may be secured to the mounting member 460 via the tabs 415 and the compliant members 462 (e.g., the plurality of teeth 465). The ratcheting function of the two tabs 415 with respective ratcheting surfaces 464 of the compliant members 462 may ensure that the rear surface 418 of the skirt 424 abuts the front surface 405 of the faceplate 402, for example, even when the collar 420 is installed over faceplates of different depths (e.g., a one-piece faceplate versus a two-piece faceplate assembly, such as the faceplate 402 and the adapter plate 404).

The translucent skirt 424 may include a plurality of stops 413. The plurality of stops 413 may be configured to prevent rotation of the collar 420 with respect to the faceplate 402. Each of the plurality of stops 413 may extend from (e.g., substantially perpendicular to) an inner surface 417 of the cylindrical shell 414. For example, the translucent skirt 424 may include a pair of stops 413 for each tab of the one or more tabs 415. The pair of stops 413 may be located on both sides of the respective tab of the one or more tabs 415. The pair of stops 413 may be configured to reduce play between the collar 420 and the mounting member 460. For example, the pair of stops 413 may be configured to abut a respective compliant member of the compliant members 462 when a rotational force is applied to the collar 420. The translucent skirt 424 may include a plurality of heat stakes 411 that extend from the shoulder 412. Each of the plurality of heat stakes 411 may be cylindrical projections that extend beyond (e.g., farther than) the cylindrical shell 414. The plurality of heat stakes 411 may be configured to secure the translucent skirt 424 to the opaque ring 422.

The opaque ring 422 may be configured to direct light emitted by the LEDs 484 toward the translucent skirt 424. The opaque ring 422 of the collar 420 may define a front surface 421, a rear surface 426, and an outer wall 429 that extends between the front surface 421 and the rear surface 426. The front surface 421 may include a plurality of holes 423 therethrough. The plurality of holes 423 may be configured to receive a corresponding plurality of heat stakes 411 defined by the translucent skirt 424. When the plurality of heat stakes 411 are received by the plurality of holes 423, the distal ends of the plurality of heat stakes 411 may be deformed (e.g., melted) to prevent removal from the plurality of holes 423. The opaque ring 422 may be attached to the translucent skirt 424, for example, using the plurality of heat stakes 411. The opaque ring 422 may include an aperture 428 defined through the front surface 421.

Figure 14:
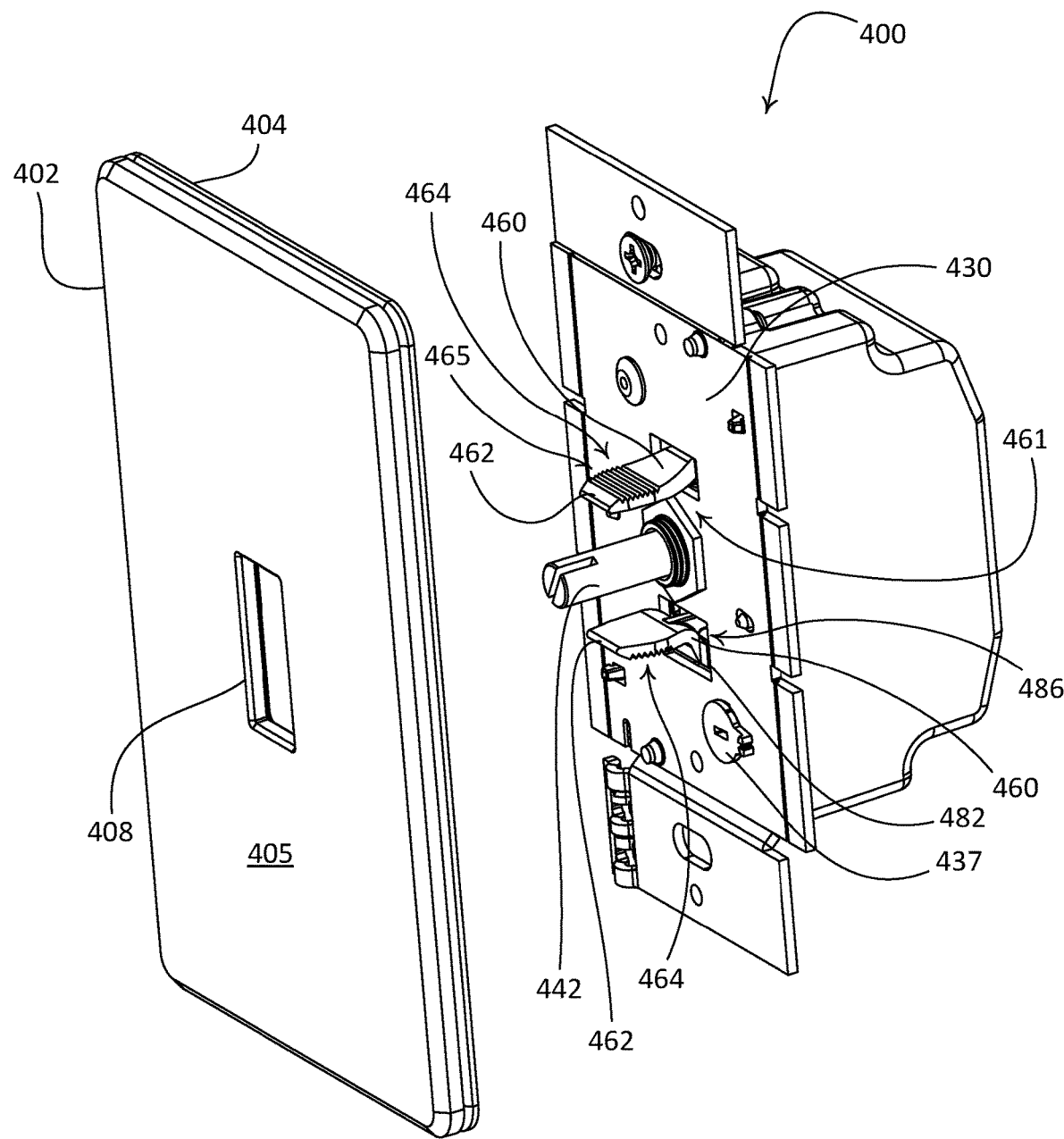
FIG. 14 is a partially exploded view of the example control device of FIG. 10 showing the faceplate detached.
Figure 15:
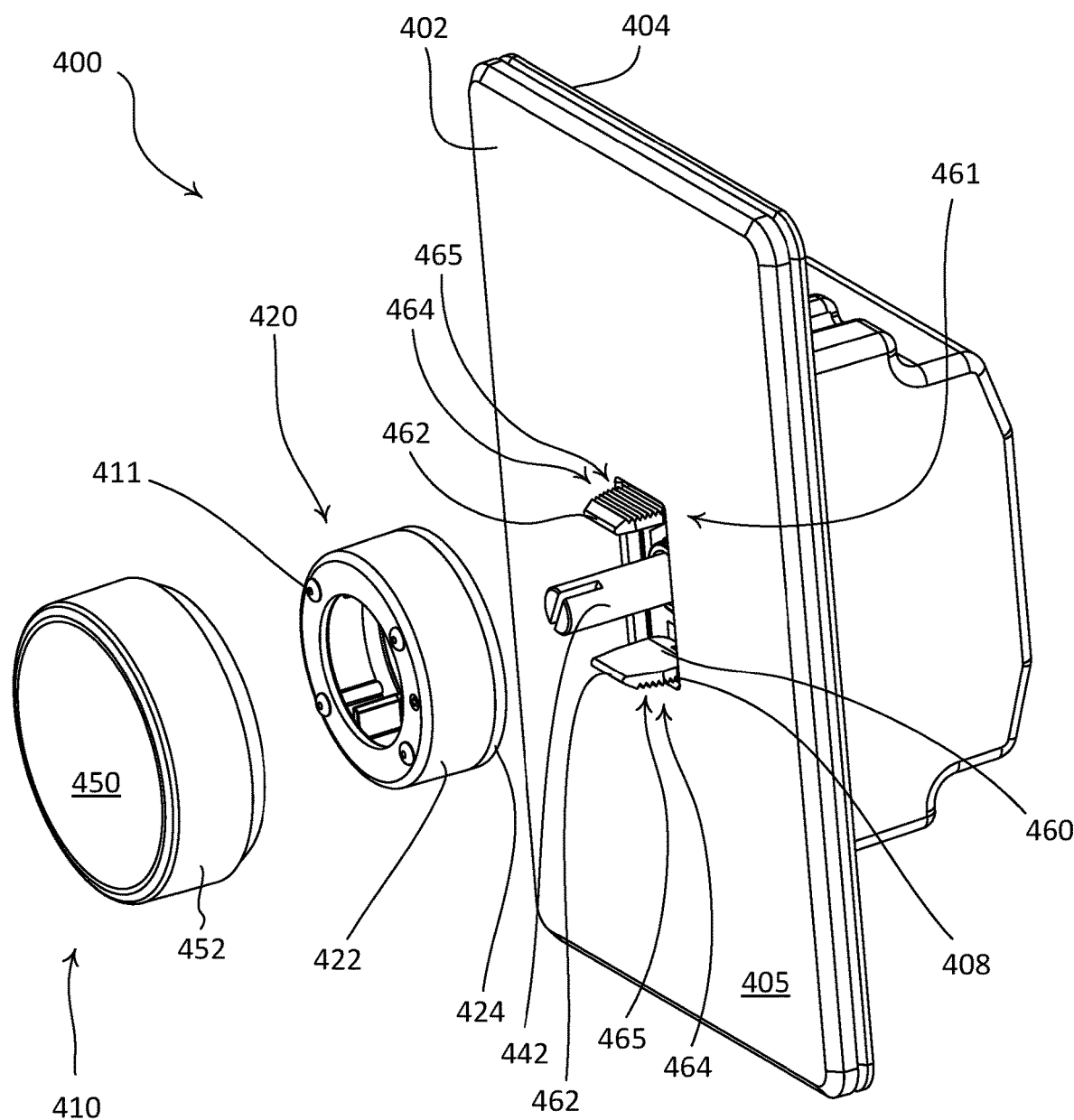
FIG. 15 is a partially exploded view of the example control device of FIG. 10 showing the rotary knob and collar detached.

The control device 400 may be configured to enter an adjustment mode (e.g., an advanced programming mode) for adjusting one or more operational characteristics of the control device and/or the lighting load controlled by the control device. the control device 400 may be configured to enter the adjustment mode, for example, in response to an actuation of a programming button (not shown). For example, the programming button may extend through an opening in the yoke 430 and may be hidden from view when the faceplate 402 and the adapter plate 404 are mounted to the yoke 430. The programming button may be actuated by a user when the faceplate 402 and adapter plate 404 are removed from the yoke 430 (e.g., as shown in FIG. 14). For example, the user may actuate the programming button while rotating the rotary knob 410 and/or the shaft 442 to adjust the operational characteristic. In addition, the user may actuate the programming button (e.g., press and hold the programming button for a period of time) to cause the control device to enter the adjustment mode before then rotating the rotary knob 410 and/or the shaft 442 to adjust the operational characteristic. The control device 400 may also be configured to enter the adjustment mode in response to an actuation of the rotary knob 410 and/or the shaft 442 (e.g., pressed in towards the faceplate 402). For example, the user may push the rotary knob in towards the faceplate 402 while rotating the rotary knob 410 and/or the shaft 442 to adjust the operational characteristic. In addition, the user may actuate the rotary knob 410 and/or the shaft 442 (e.g., press and hold the rotary knob 410 in towards the faceplate 402 for a period of time) to cause the control device to enter the adjustment mode before then rotating the rotary knob 410 and/or the shaft 442 to adjust the operational characteristic.

The control device 400 may be configured to provide feedback in the adjustment mode. For example, the control device 400 may be configured to control the LEDs 484 to strobe or blink the illumination emitted through the translucent skirt 424 of the collar 420 (e.g., the nightlight illumination) to provide visible feedback. In addition, the control device 400 may comprise a visual indicator, such as an additional LED, that may be viewed when the faceplate 402 and the adapter plate 404 are removed from the yoke 430 and may be illuminated to provide visible feedback. For example, the control device 400 may provide the visible feedback when first entering the adjustment mode, while in the adjustment mode, or after the operational characteristic is adjusted.

The control device 400 may adjust an operational characteristic other than the intensity of the lighting load in response to rotations of the rotary knob 410 and/or the shaft 442 while in the adjustment mode. For example, the control device 400 may be configured to adjust a color (e.g., a color temperature) of the lighting load in response to rotations of the rotary knob 410 and/or the shaft 442. In addition, the control device 400 may be configured to adjust an intensity of the nightlight illumination (e.g., the maximum nightlight illumination) in response to rotations of the rotary knob 410 and/or the shaft 442. Further, the control device 400 may be configured to adjust the high-end trim and/or the low-end trim in response to rotations of the rotary knob 410 and/or the shaft 442.

Figure 22:
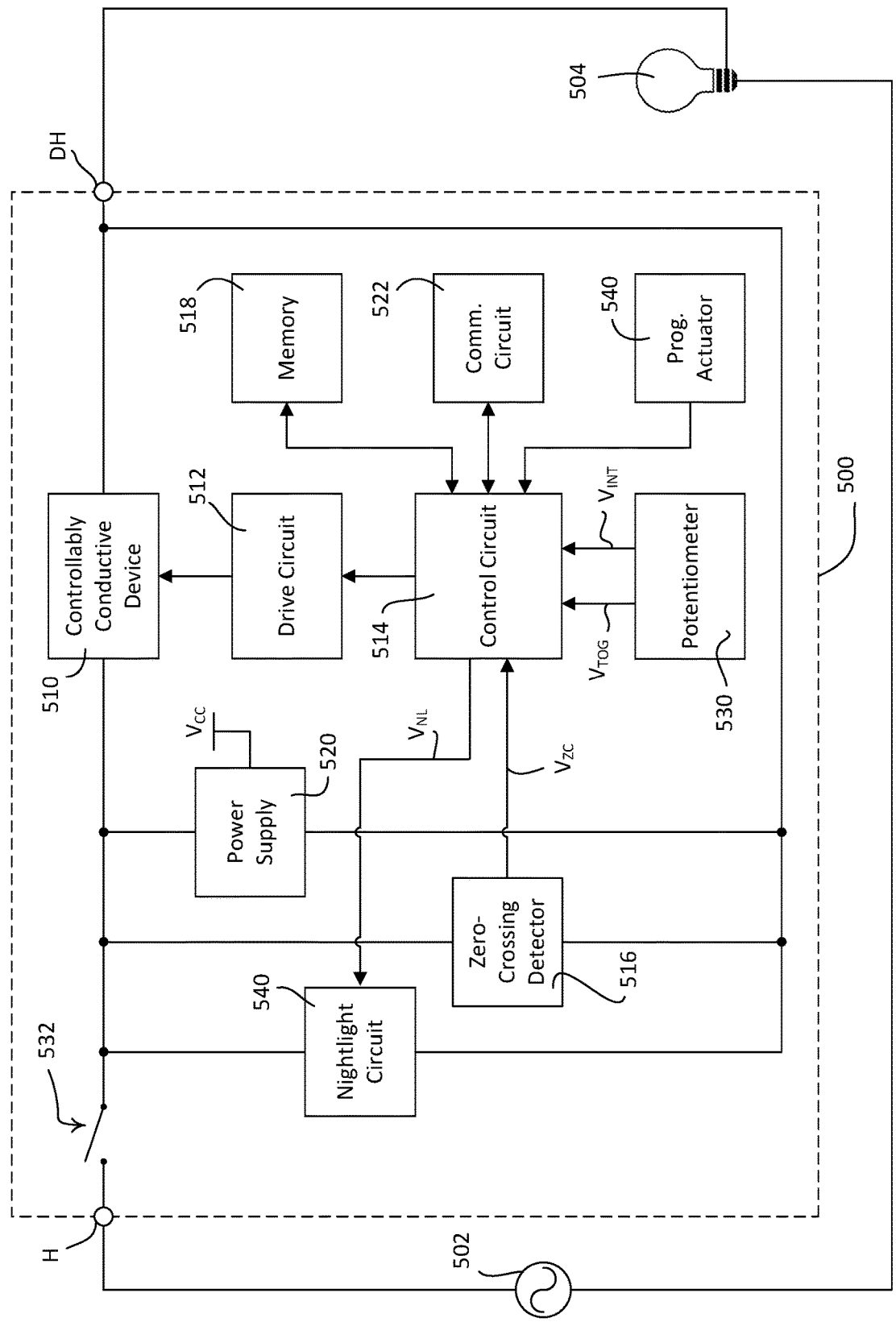
FIG. 22 shows a simplified block diagram of an example control device that may be deployed as a dimmer switch of the load control system illustrated in FIG. 1.

FIG. 22 is a simplified block diagram of an example control device 500 (e.g., a dimmer switch) that may be deployed as, for example, the dimmer switch 110 of the lighting control system 100, the control device 200, the control device 300, and/or the control device 400. The control device 500 may include a hot terminal H that may be adapted to be coupled to an AC power source 502. The control device 500 may include a dimmed hot terminal DH that may be adapted to be coupled to an electrical load, such as a lighting load 504. The control device 500 may include a controllably conductive device 510 coupled in series electrical connection between the AC power source 502 and the lighting load 504. The controllably conductive device 510 may control the power delivered to the lighting load. The controllably conductive device 510 may include a relay and/or a bidirectional semiconductor switch, such as, for example, a triac, a field-effect transistor (FET) in a rectifier bridge, two FETs in anti-series connection, one or more insulated-gate bipolar junction transistors (IGBTs), or other suitable semiconductor switching circuit.

The control device 500 may include a control circuit 514. The control circuit 514 may include one or more of a processor (e.g., a microprocessor), a microcontroller, a programmable logic device (PLD), a field programmable gate array (FPGA), an application specific integrated circuit (ASIC), or any suitable controller or processing device. The control circuit 514 may be operatively coupled to a control input of the controllably conductive device 510, for example, via a gate drive circuit 512. The control circuit 514 may be used for rendering the controllably conductive device 510 conductive or non-conductive, for example, to turn the lighting load 504 on and off and/or to control the amount of power delivered to the lighting load 504.

The control circuit 514 may receive a zero-cross control signal $V_{ZC}$. The $V_{ZC}$ may be representative of the zero-crossing points of the AC main line voltage of the AC power source 502, from a zero-crossing detector 516. The control circuit 514 may be operable to render the controllably conductive device 510 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The control device 500 may include a memory 518. The memory 518 may be communicatively coupled to the control circuit 514 for the storage and/or retrieval of, for example, operational settings, such as, lighting presets and associated preset light intensities. The memory 518 may be implemented as an external integrated circuit (IC) or as an internal circuit of the control circuit 514. The control device 500 may include a power supply 520. The power supply 520 may generate a direct-current (DC) supply voltage $V_{CC}$ for powering the control circuit 514 and the other low-voltage circuitry of the control device 500. The power supply 520 may be coupled in parallel with the controllably conductive device 510. The power supply 520 may be operable to conduct a charging current through the lighting load 504 to generate the DC supply voltage $V_{CC}$.

The control device 500 may comprise a communication circuit 522. The communication circuit 522 may comprise a wireless communication circuit, for example, a radio-frequency (RF) transceiver coupled to an antenna for transmitting and/or receiving RF signals, an RF transmitter for transmitting RF signals, an RF receiver for receiving RF signals, or an infrared (IR) transmitter and/or receiver for transmitting and/or receiving IR signals. The communication circuit 522 may also comprise a wired communication circuit configured to be coupled to a wired control link, for example, a digital communication link and/or an analog control link, such as a 0-10V control link or a pulse-width modulated (PWM) control link. In addition, the communication circuit 522 may be coupled to the electrical wiring between the control device 500 and the lighting load 504 and may be configured to transmit a control signal to the lighting load 504 via the electrical wiring using, for example, a power-line carrier (PLC) communication technique. The communication circuit 522 may be configured to transmit a control signal that includes the control data (e.g., a digital message) generated by the control circuit 514 to the lighting load 504. As described herein, the control data may be generated in response to a user input to adjust one or more operational aspects of the lighting load 504. The control data may include a command and/or identification information (e.g., such as a unique identifier) associated with the control device 500. In addition to or in lieu of transmitting the control signal to the lighting load 504, the communication circuit 522 may be controlled to transmit the control signal to a central controller of the lighting control system.

The control circuit 514 may be responsive to inputs received from a potentiometer 530 (e.g., the potentiometer 240 and/or the potentiometer 440). For example, the potentiometer 530 may comprise a shaft (e.g., the shaft 242 and/or the shaft 442) coupled to a rotary knob (e.g., the rotary knob 210, the rotary knob 310, and/or the rotary knob 410). The potentiometer 530 may be configured to generate a toggle control signal $V_{TOG}$ that indicates actuations of the rotary knob that push the shaft of the potentiometer 530 in towards the faceplate. For example, the potentiometer 530 may comprise a momentary tactile switch that may be temporarily closed in response to actuations of the rotary knob that push the shaft of the potentiometer 530 in towards the faceplate (e.g., the toggle control signal $V_{TOG}$ be referenced between the supply voltage $V_{CC}$ and circuit common). The potentiometer 530 may also be configured to generate an intensity control signal $V_{INT}$ that indicates the intensity to which to control the lighting load. For example, the intensity control signal $V_{INT}$ may comprise a direct-current (DC) voltage having a magnitude that is responsive to rotations of the shaft of the potentiometer 530. The control circuit 514 may be configured to receive the toggle control signal $V_{TOG}$ and the intensity control signal $V_{INT}$ from the potentiometer 530. The control circuit 514 may be configured to control the controllably conductive device 510 to turn the lighting load on and off in response to the toggle control signal $V_{TOG}$ and to adjust the intensity of the lighting load in response to the intensity control signal $V_{INT}$. In addition, the potentiometer 530 may comprise a maintained mechanical switch 532 (e.g., an air-gap switch) that may be coupled in series between the hot terminal H and the dimmed hot terminal DH (e.g., in series with the controllably conductive device 510). The maintained mechanical switch 532 may be opened and closed (e.g., toggled between an open state and a closed state) in response to actuations of the rotary knob that push the shaft of the potentiometer 530 in towards the faceplate to connect and disconnect the lighting load 504 from the AC power source 502 to turn the lighting load on and off, respectively.

The control device 500 may comprise a nightlight circuit 540 coupled in parallel with the controllably conductive device 510. For example, the nightlight circuit 540 may comprise one or more light sources configured to illuminate the rotary knob to provide a nightlight feature. For example, the nightlight circuit 540 may comprise one or more LEDs (e.g., the LEDs 284 and/or the LEDs 484). In addition, the nightlight circuit 540 may comprise one or more neon bulbs coupled in series with a resistor. The intensity of the illumination provided by the nightlight circuit 540 may be dependent upon the voltage developed across the nightlight circuit 540. Since the nightlight circuit 540 is coupled in parallel with the controllably conductive device 510, the intensity of the illumination provided by the nightlight circuit 540 varies as the control circuit 514 adjusts the intensity of the lighting load 504. For example, the intensity of the illumination provided by the nightlight circuit 540 may increase as the intensity of the lighting load 514 decreases, and vice versa. The intensity of the nightlight circuit 540 may be controlled to a maximum nightlight illumination when the lighting load 504 is off. The control circuit 514 may be configured to generate a nightlight control signal $V_{NL}$ for controlling the nightlight circuit 540 (e.g., to enable or disable the nightlight circuit and/or to adjust the maximum nightlight illumination of the nightlight circuit).

The control circuit 514 may be configured to enter an adjustment mode (e.g., an advanced programming mode) for adjusting one or more operational characteristics of the control device 500 and/or the lighting load 504. The control circuit 514 may be configured to enter the adjustment mode in response to an actuation a programming actuator 540. For example, the programming actuator 540 may comprise a momentary tactile switch that may be temporarily closed in response to actuations of a button (e.g., a programming button that may extend through an opening in the yoke 430). For example, the control circuit 514 may be configured to adjust the operational characteristic in response to a rotation of the shaft of the potentiometer 530 (e.g., in response to the intensity control signal $V_{INT}$) while the programming actuator 540 is closed. In addition, the control circuit 514 may be configured to enter the adjustment mode in response to a press and hold of the programming button 540 for a period of time and then adjust the operational characteristic in response to a rotation of the shaft of the potentiometer 530. The control circuit 514 may also be configured to enter the adjustment mode in response to an actuation of the rotary knob that pushes the shaft of the potentiometer 530 in towards the faceplate (e.g., in response to the toggle control signal $V_{TOG}$). For example, the control circuit 512 may be configured to adjust the operational characteristic in response to a rotation of the shaft of the potentiometer 530 while the tactile switch of the potentiometer 530 is closed. In addition, the control circuit 512 may be configured to enter the adjustment mode in response to a press and hold of the rotary knob that pushes the shaft of the potentiometer 530 in towards the faceplate for a period of time (e.g., a maintained close of the tactile switch of the potentiometer 530) and then adjust the operational characteristic in response to a rotation of the shaft of the potentiometer 530.

The control circuit 514 may be configured to provide feedback in the adjustment mode. For example, the control circuit 514 may be configured to control the nightlight circuit 540 (e.g., via the nightlight control signal $V_{NL}$ to strobe or blink the illumination emitted by the nightlight circuit 540) to provide visible feedback. In addition, the control device 400 may comprise a visual indicator, such as an additional LED (not shown), that may be controlled by the control circuit 514 and illuminated to provide visible feedback. For example, the control circuit 514 may provide the visible feedback when first entering the adjustment mode, while in the adjustment mode, or after the operational characteristic is adjusted.

The control circuit 514 may be configured to adjust an operational characteristic other than the intensity of the lighting load 504 in response to rotations of the shaft of the potentiometer 530 while in the adjustment mode. For example, the control circuit 514 may be configured to adjust a color (e.g., a color temperature) of the lighting load in response to rotations of the shaft of the potentiometer 530. The control circuit 514 may be configured to adjust the color of the lighting load 504, for example, by transmitting a digital message using the communication circuit 522. In addition, the control circuit 514 may be configured to adjust an intensity of the nightlight illumination (e.g., the maximum nightlight illumination) in response to rotations of the shaft of the potentiometer 530. Further, the control circuit 514 may be configured to adjust the high-end trim and/or the low-end trim of the control device 500 in response to rotations of the shaft of the potentiometer 530.

What is claimed is:

1. A wall-mountable load control device configured to control an intensity of a lighting load, the load control device comprising:
    a yoke adapted to be mounted to an electrical wall box;
    an enclosure attached to the yoke;
    a faceplate attached to the yoke and having an opening;
    a mounting member attached to the yoke and having an attachment portion extending through the opening of the faceplate;
    a potentiometer located within the enclosure and having a shaft extending through an opening in the yoke and the opening of the faceplate;
    a rotary knob having a planar surface and a circular sidewall extending from a periphery of the planar surface to form a cavity in the rotary knob, the rotary knob comprising a shaft-attachment member located within the cavity and attached to the shaft of the potentiometer;
    a collar attached to the attachment portion of the mounting member and surrounding the shaft of the potentiometer; and
    at least one light source configured to illuminate at least a portion of the collar,
    wherein the collar is received in the cavity of the rotary knob when the rotary knob is attached to the shaft of the potentiometer, and
    wherein light emitted by the at least one light source is directed through a gap between the rotary knob and a front surface of the faceplate.

2. The load control device of claim 1, wherein the attachment portion comprises at least one boss extending through the opening of the faceplate.

3. The load control device of claim 2, wherein the collar is configured to be attached to the at least one boss via a screw received through an opening in a tab of the collar and an opening in the boss of the mounting member.

4. The load control device of claim 1, further comprising a printed circuit board located within the enclosure, wherein the at least one light source is mounted to the printed circuit board.

5. The load control device of claim 4, wherein the potentiometer extends from a middle portion of the printed circuit board.

6. The load control device of claim 5, wherein the mounting member comprises a light pipe structure that extends proximate to a top and bottom of the potentiometer to the at least one light source mounted to the printed circuit board.

7. The load control device of claim 1, wherein the attachment portion comprises compliant members that extend through the opening of the faceplate, each of the compliant members comprising a ratcheting surface.

8. The load control device of claim 7, wherein the ratcheting surface of the compliant members comprises a plurality of teeth and the collar comprises a pair of tabs extending from an inner surface of the collar, the tabs configured to engage adjacent teeth of the plurality of teeth of a respective compliant member to attach the collar to the mounting member.

9. The load control device of claim 1, wherein the mounting member is configured to conduct the light emitted by the at least one light source to illuminate at least the portion of the collar.

10. The load control device of claim 9, wherein the at least one light source is housed within the enclosure, and wherein the mounting member further comprises a light pipe structure configured to extend proximate to a top and bottom of the potentiometer to the at least one light source to conduct light emitted by the at least one light source to illuminate at least the portion of the collar.

11. The load control device of claim 10, wherein the at least one light source is mounted to a printed circuit board located within the enclosure.

12. The load control device of claim 1, wherein the rotary knob comprises a visible indicator configured to be illuminated by the light emitted by the at least one light source.

13. The load control device of claim 1, wherein the collar comprises an opaque portion and a translucent portion, the mounting member configured to conduct the light emitted by the at least one light source housed within the enclosure to illuminate the translucent portion of the collar.

14. The load control device of claim 13, wherein the light emitted by the at least one light source is configured to illuminate the front surface of the faceplate.

15. A wall-mountable load control device configured to control an intensity of a lighting load, the load control device comprising:
a yoke adapted to be mounted to an electrical wall box;
an enclosure attached to the yoke;
a faceplate attached to the yoke and having an opening;
a mounting member attached to the yoke and having an attachment portion extending through the opening of the faceplate;
a potentiometer located within the enclosure and having a shaft extending through an opening in the yoke and the opening of the faceplate;
a rotary knob having a planar surface and a circular sidewall extending from a periphery of the planar surface to form a cavity in the rotary knob, the rotary knob comprising a shaft-attachment member located within the cavity and attached to the shaft of the potentiometer; and
a collar attached to the attachment portion of the mounting member and surrounding the shaft of the potentiometer,
wherein the collar is received in the cavity of the rotary knob when the rotary knob is attached to the shaft of the potentiometer.

16. The load control device of claim 15, wherein the attachment portion comprises at least one boss extending through the opening of the faceplate.

17. The load control device of claim 16, wherein the collar is configured to be attached to the at least one boss via a screw received through an opening in a tab of the collar and an opening in the boss of the mounting member.

18. The load control device of claim 15, wherein the attachment portion comprises compliant members that extend through the opening of the faceplate, each of the compliant members comprising a ratcheting surface.

19. The load control device of claim 18, wherein the ratcheting surface of the compliant members comprises a plurality of teeth and the collar comprises a pair of tabs extending from an inner surface of the collar, the tabs configured to engage adjacent teeth of the plurality of teeth of a respective compliant member to attach the collar to the mounting member.

20. The load control device of claim 15, wherein the mounting member is configured to conduct light from at least one light source housed within the enclosure to illuminate one or more of the rotary knob or the faceplate.

21. The load control device of claim 20, wherein the mounting member further comprises a light pipe structure configured to extend proximate to a top and bottom of the potentiometer to the at least one light source to conduct the light from the at least one light source to illuminate the faceplate.

22. The load control device of claim 21, wherein the light pipe structure is configured to direct the light through a gap between the rotary knob and the faceplate.

23. The load control device of claim 20, wherein the rotary knob comprises a visible indicator configured to be illuminated by the light from the at least one light source.

24. The load control device of claim 15, wherein the collar comprises an opaque portion and a translucent portion, the mounting member configured to conduct light from at least one light source housed within the enclosure to illuminate the translucent portion of the collar.

\* \* \* \* \*